us011756997B2

(12) United States Patent
Fung

(10) Patent No.: US 11,756,997 B2
(45) Date of Patent: Sep. 12, 2023

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventor: Ka-Hing Fung, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 101 days.

(21) Appl. No.: 17/075,344

(22) Filed: Oct. 20, 2020

(65) Prior Publication Data
US 2021/0134952 A1 May 6, 2021

Related U.S. Application Data

(60) Provisional application No. 62/928,629, filed on Oct. 31, 2019.

(51) Int. Cl.
| | |
|---|---|
| *H01L 29/06* | (2006.01) |
| *H01L 29/417* | (2006.01) |
| *H01L 29/66* | (2006.01) |
| *H01L 21/8234* | (2006.01) |
| *H01L 29/78* | (2006.01) |

(52) U.S. Cl.
CPC .. *H01L 29/0673* (2013.01); *H01L 21/823431* (2013.01); *H01L 29/41791* (2013.01); *H01L 29/6656* (2013.01); *H01L 29/66803* (2013.01); *H01L 29/7848* (2013.01); *H01L 29/7851* (2013.01)

(58) Field of Classification Search
CPC .......... H01L 29/66545; H01L 29/0673; H01L 29/42392; H01L 29/78696; H01L 29/66469; H01L 29/66439; H01L 29/775; H01L 29/41791; H01L 29/41725; H01L 29/41775; H01L 21/823418; H01L 21/823431
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,343,300 B1 * | 5/2016 | Jacob | ................ H01L 21/02579 |

(Continued)

FOREIGN PATENT DOCUMENTS

WO WO-2017052617 A1 * 3/2017 ............. B82Y 10/00

*Primary Examiner* — Errol V Fernandes
*Assistant Examiner* — Jeremy J Joy
(74) *Attorney, Agent, or Firm* — Birch, Stewart, Kolasch & Birch, LLP

(57) ABSTRACT

A semiconductor structure is provided. The semiconductor structure includes a plurality of nanostructures vertically stacked and separated from one another. The semiconductor structure also includes a gate stack wrapping around the plurality of nanostructures. The semiconductor structure also includes a source/drain feature adjacent to the plurality of nanostructures. The semiconductor structure also includes a semiconductor inner spacer layer interposing between the gate stack and the source/drain feature and interposing between the plurality of nanostructures and the source/drain feature.

20 Claims, 28 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,590,038 B1 * | 3/2017 | Kim ............... H01L 29/78696 |
| 9,608,116 B2 | 3/2017 | Ching et al. |
| 10,672,868 B2 * | 6/2020 | Jambunathan .... H01L 29/41725 |
| 10,756,216 B2 * | 8/2020 | Miao ............... H01L 29/78696 |
| 10,832,907 B2 * | 11/2020 | Cheng ............... H01L 29/6653 |
| 2013/0161756 A1 * | 6/2013 | Glass ............... H01L 29/775 |
| | | 257/E21.632 |
| 2014/0264280 A1 * | 9/2014 | Kim ............... H01L 29/785 |
| | | 257/29 |
| 2015/0034899 A1 * | 2/2015 | Ching ............... H01L 29/1033 |
| | | 438/154 |
| 2017/0110554 A1 * | 4/2017 | Tak ............... H01L 29/42392 |
| 2017/0154958 A1 * | 6/2017 | Fung ............... H01L 29/42392 |
| 2017/0154973 A1 * | 6/2017 | Ching ............... H01L 29/42392 |
| 2018/0006139 A1 * | 1/2018 | Seo ............... H01L 29/6653 |
| 2018/0114834 A1 * | 4/2018 | Cheng ............... H01L 21/02167 |
| 2018/0151733 A1 * | 5/2018 | Glass ............... H01L 29/42392 |
| 2019/0131431 A1 * | 5/2019 | Cheng ............... H01L 29/66439 |
| 2020/0273998 A1 * | 8/2020 | Jambunathan .... H01L 29/66553 |
| 2020/0411669 A1 * | 12/2020 | Sharma ............... H01L 29/775 |

* cited by examiner

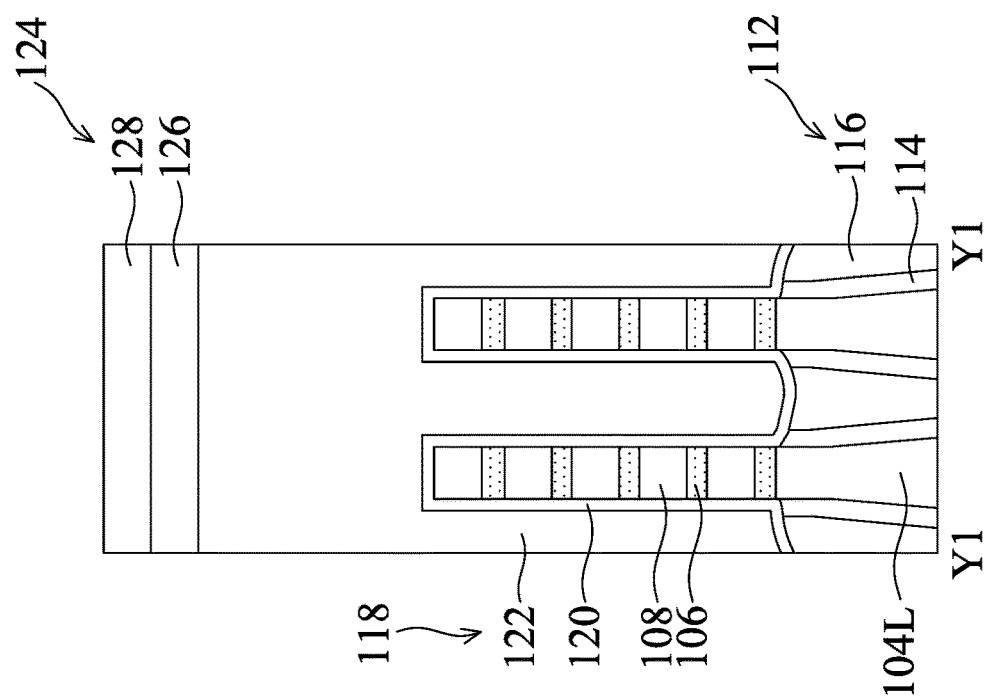
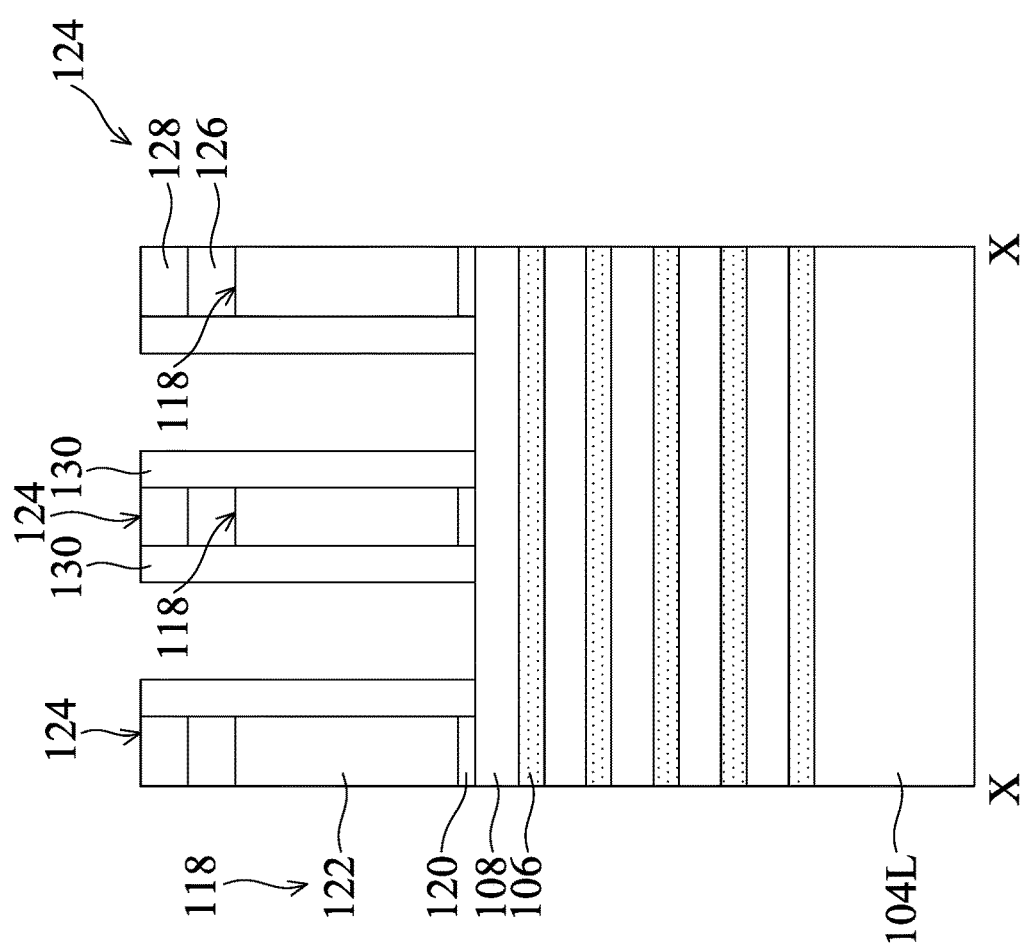
FIG. 1D-2
FIG. 1D-1

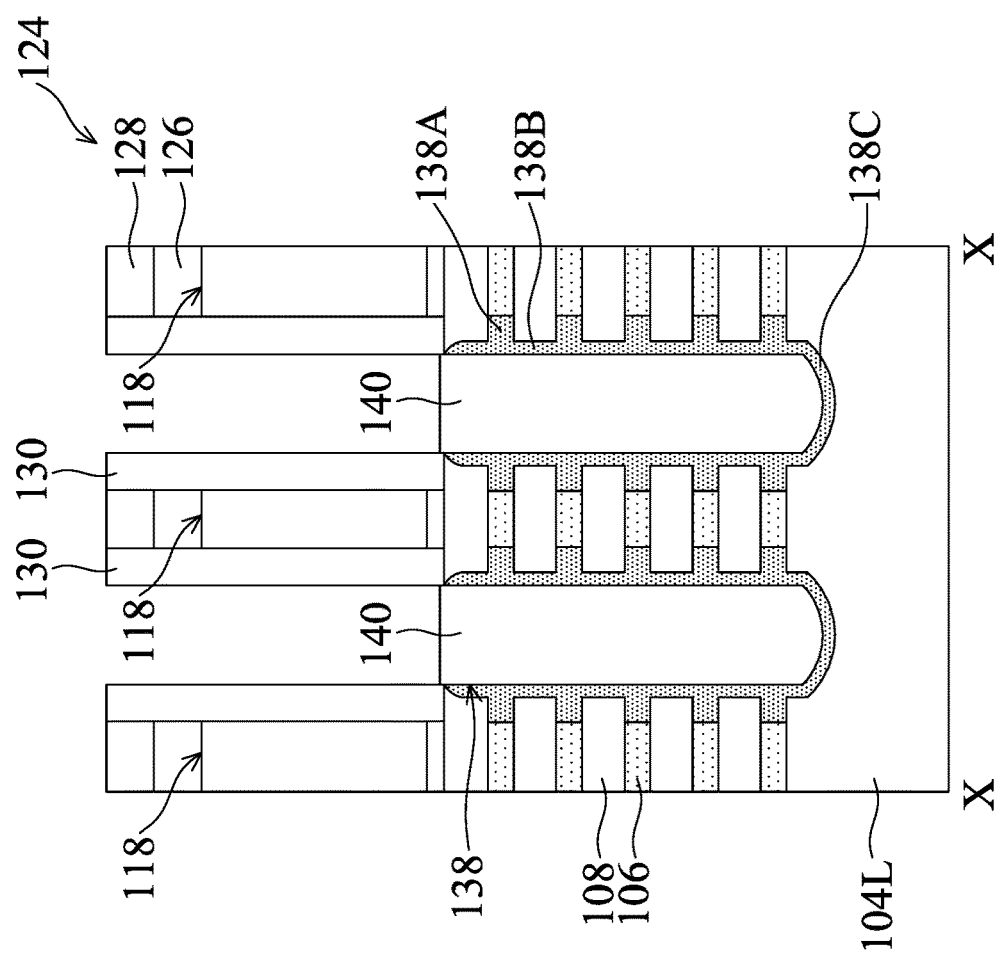
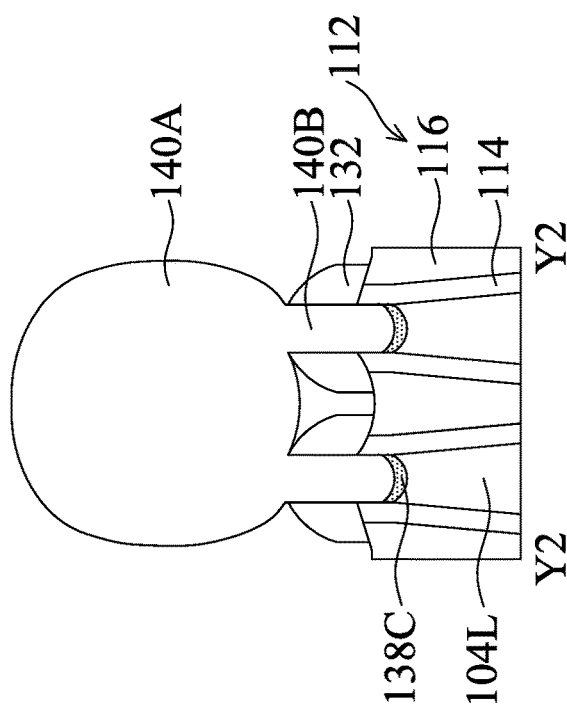
FIG. 1H-1
FIG. 1H-2

US 11,756,997 B2

1

SEMICONDUCTOR STRUCTURE AND METHOD FOR FORMING THE SAME

PRIORITY CLAIM

This application claims the benefit of U.S. Provisional Application No. 62/928,629, filed on Oct. 31, 2019 and entitled "Gate-All-Around doping junction structure and method," the entirety of which is incorporated by reference herein.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary, metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1C-1 and 1C-2 are cross-sectional views of a semiconductor structure of FIG. 1C, in accordance with some embodiments of the disclosure.

2

Figure 1A:
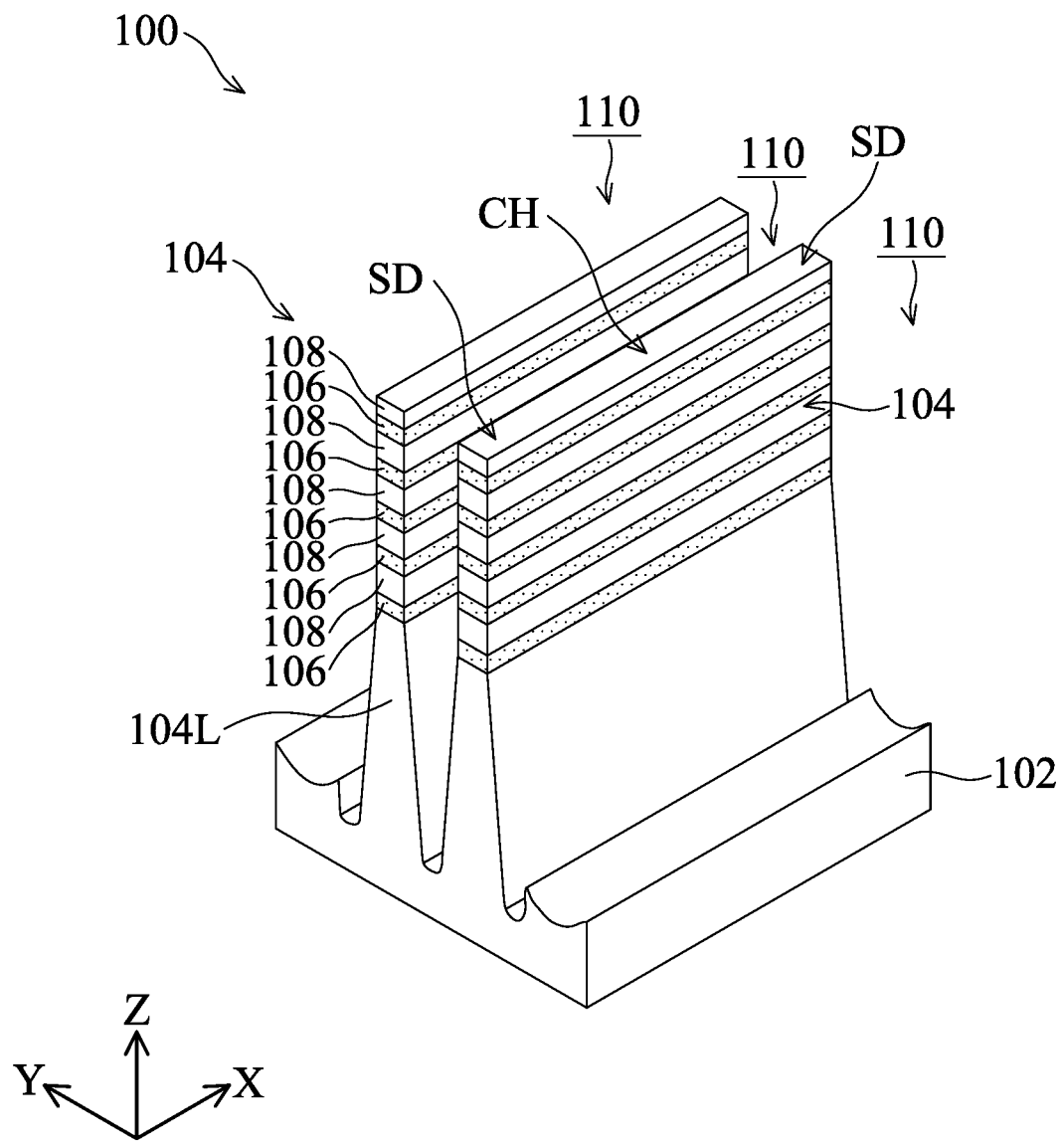
FIG. 1A is a perspective view illustrating the formation of a semiconductor device at an intermediate stage, in accordance with some embodiments of the disclosure.
Figure 1B:
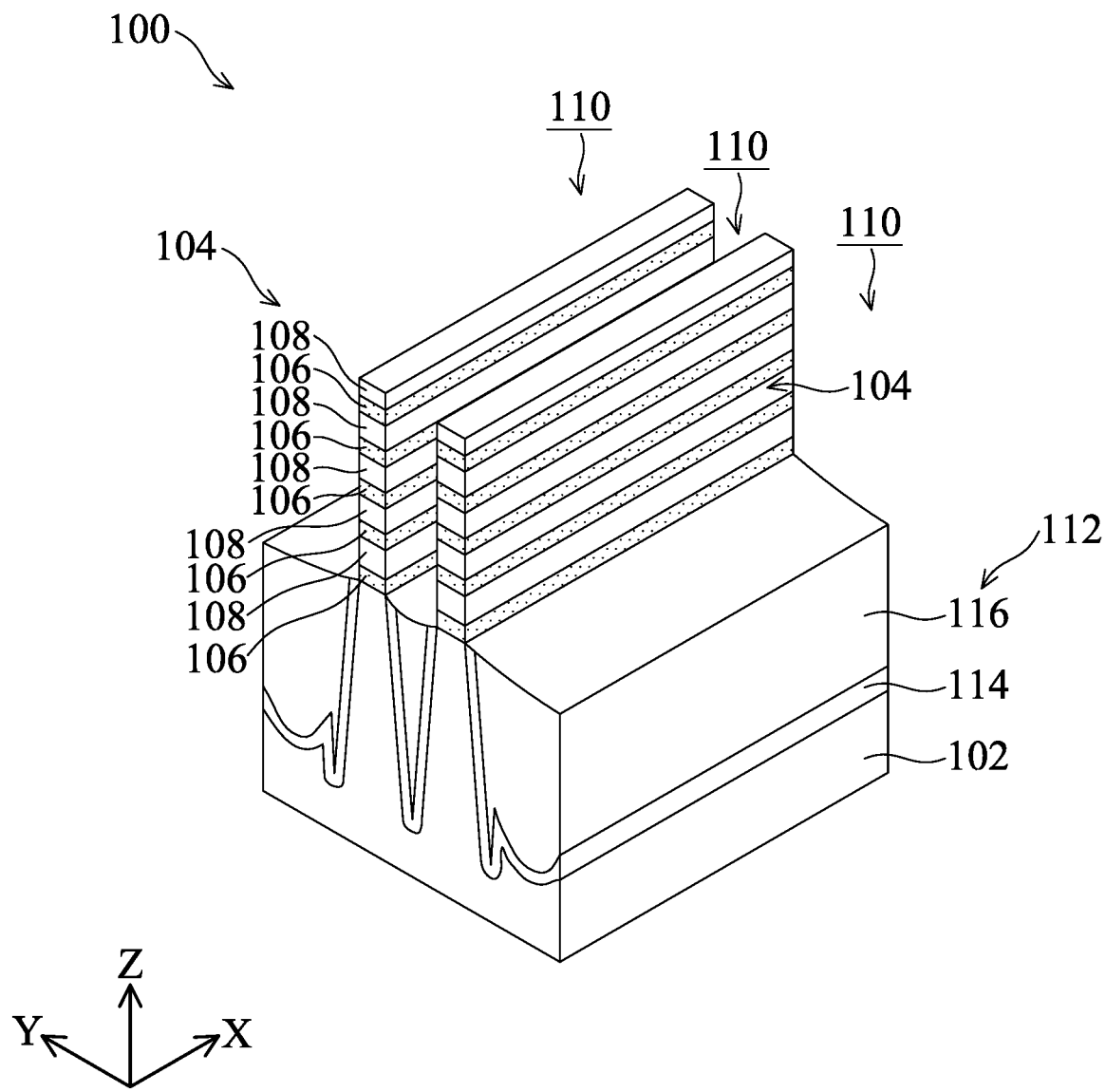
FIG. 1B is a perspective view illustrating the formation of a semiconductor device at an intermediate stage, in accordance with some embodiments of the disclosure.
Figure 1C:
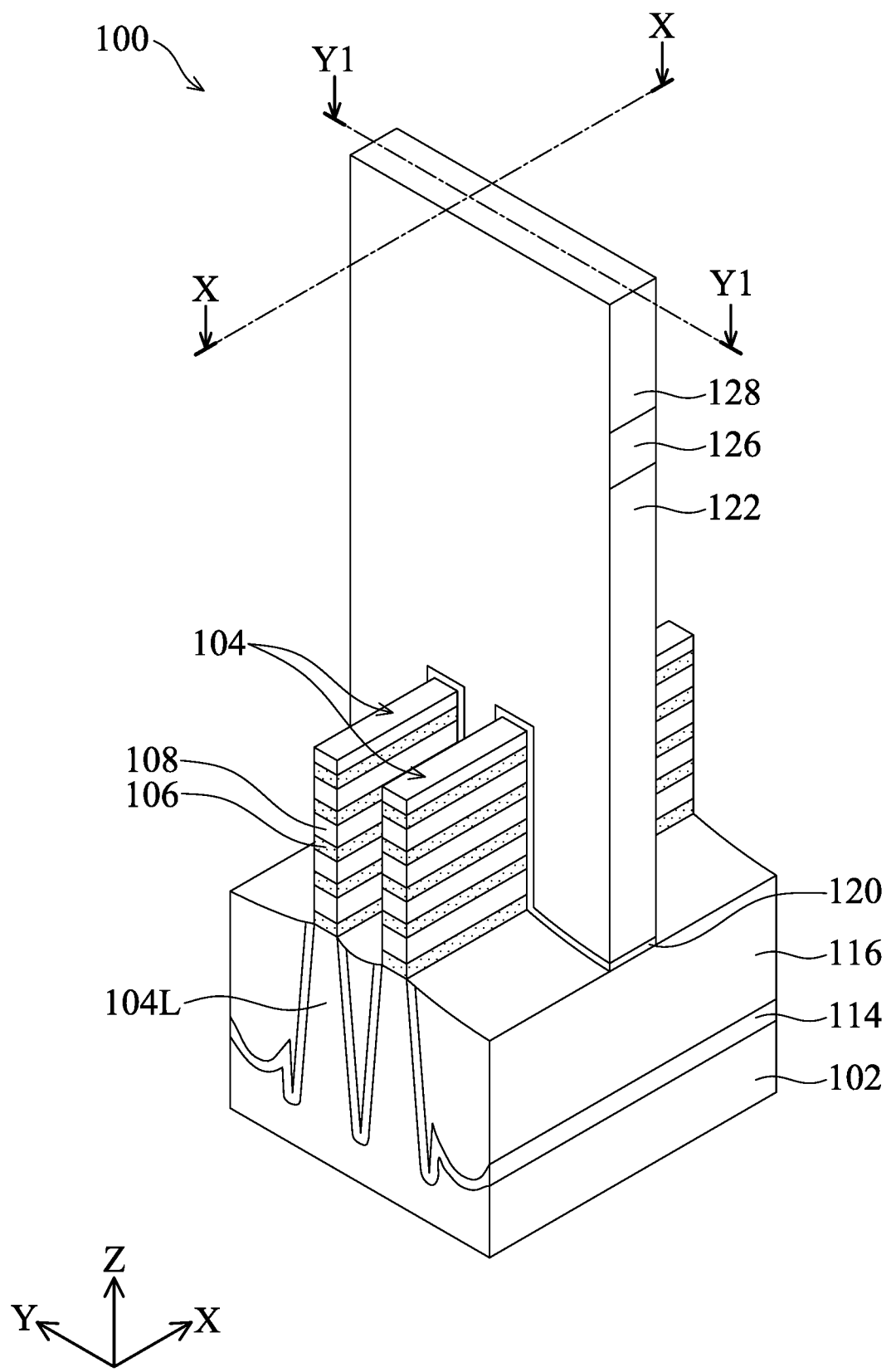
FIG. 1C is a perspective view illustrating the formation of a semiconductor device at an intermediate stage, in accordance with some embodiments of the disclosure.
Figures 1, 1C, 2:
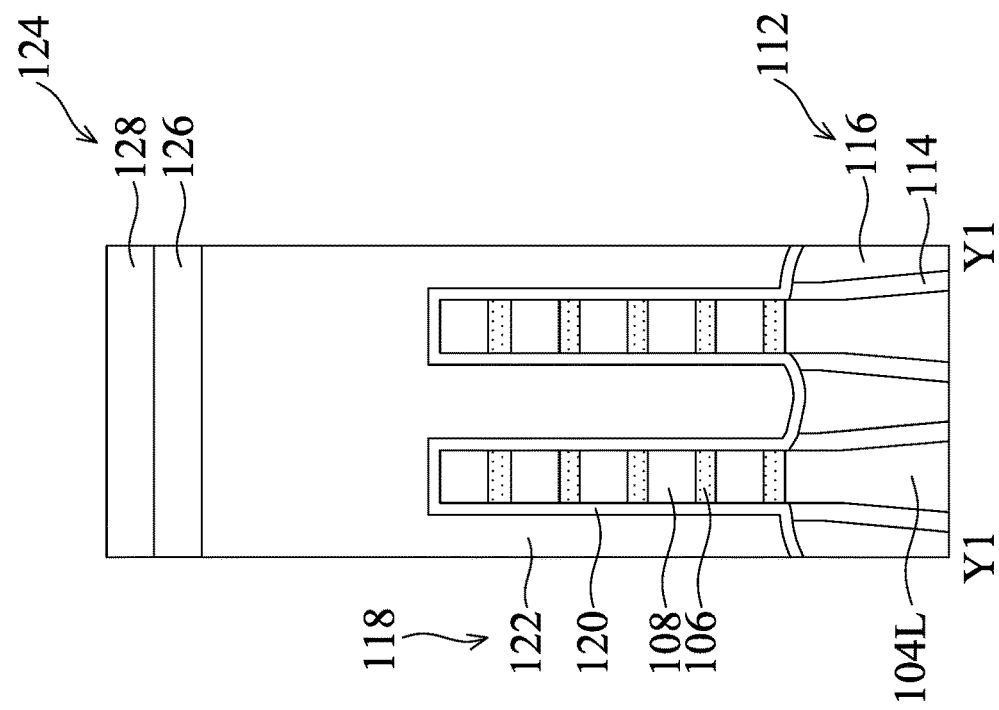
Figures 1, 1C:
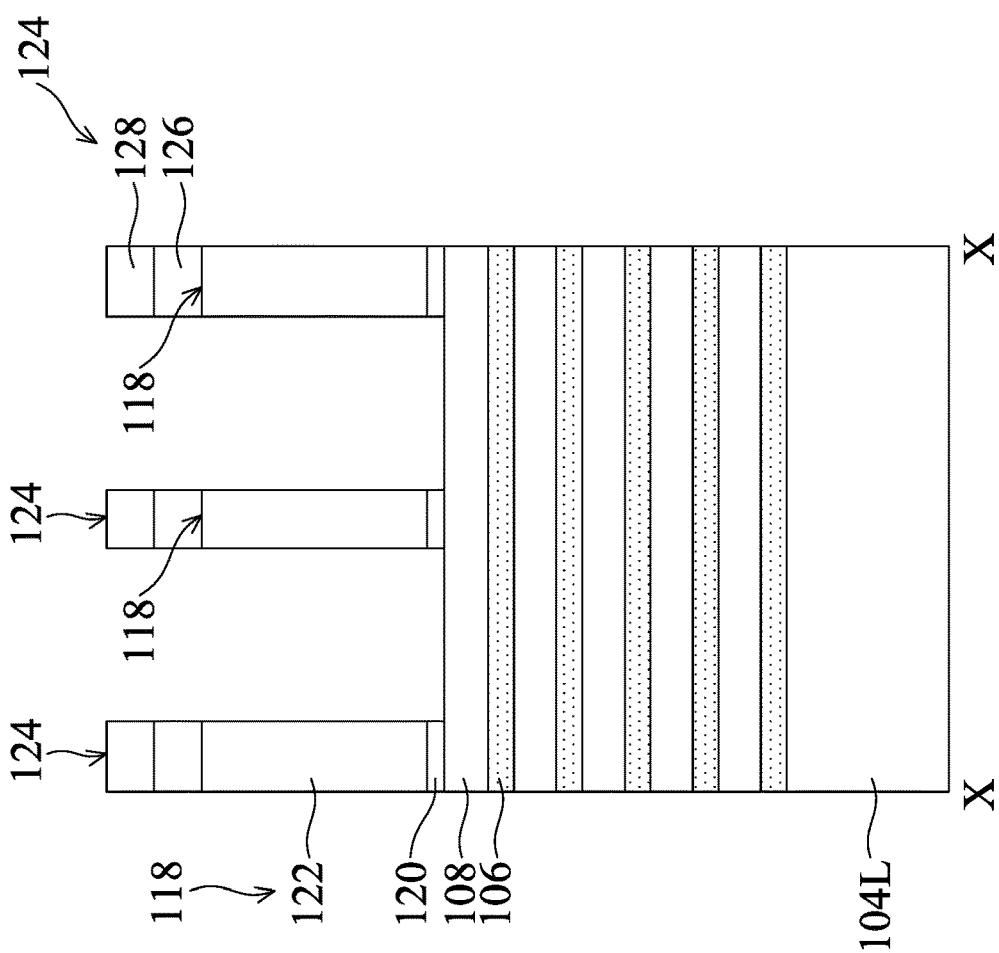
Figure 1D:
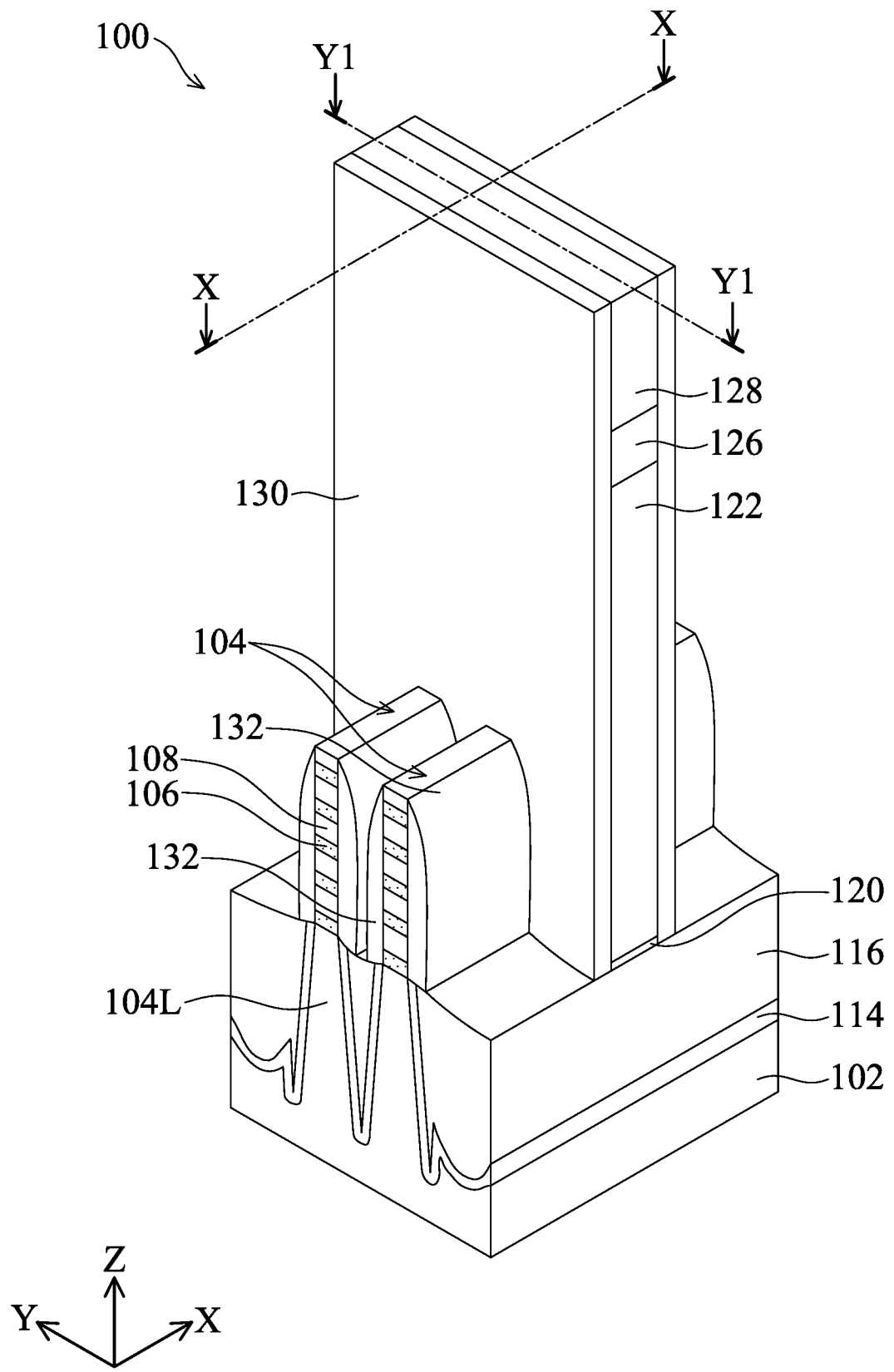

FIG. 1D is a perspective view illustrating the formation of a semiconductor device at an intermediate stage, in accordance with some embodiments of the disclosure;

FIGS. 1D-1 and 1D-2 are cross-sectional views of a semiconductor structure of FIG. 1D, in accordance with some embodiments of the disclosure.

Figure 1E:
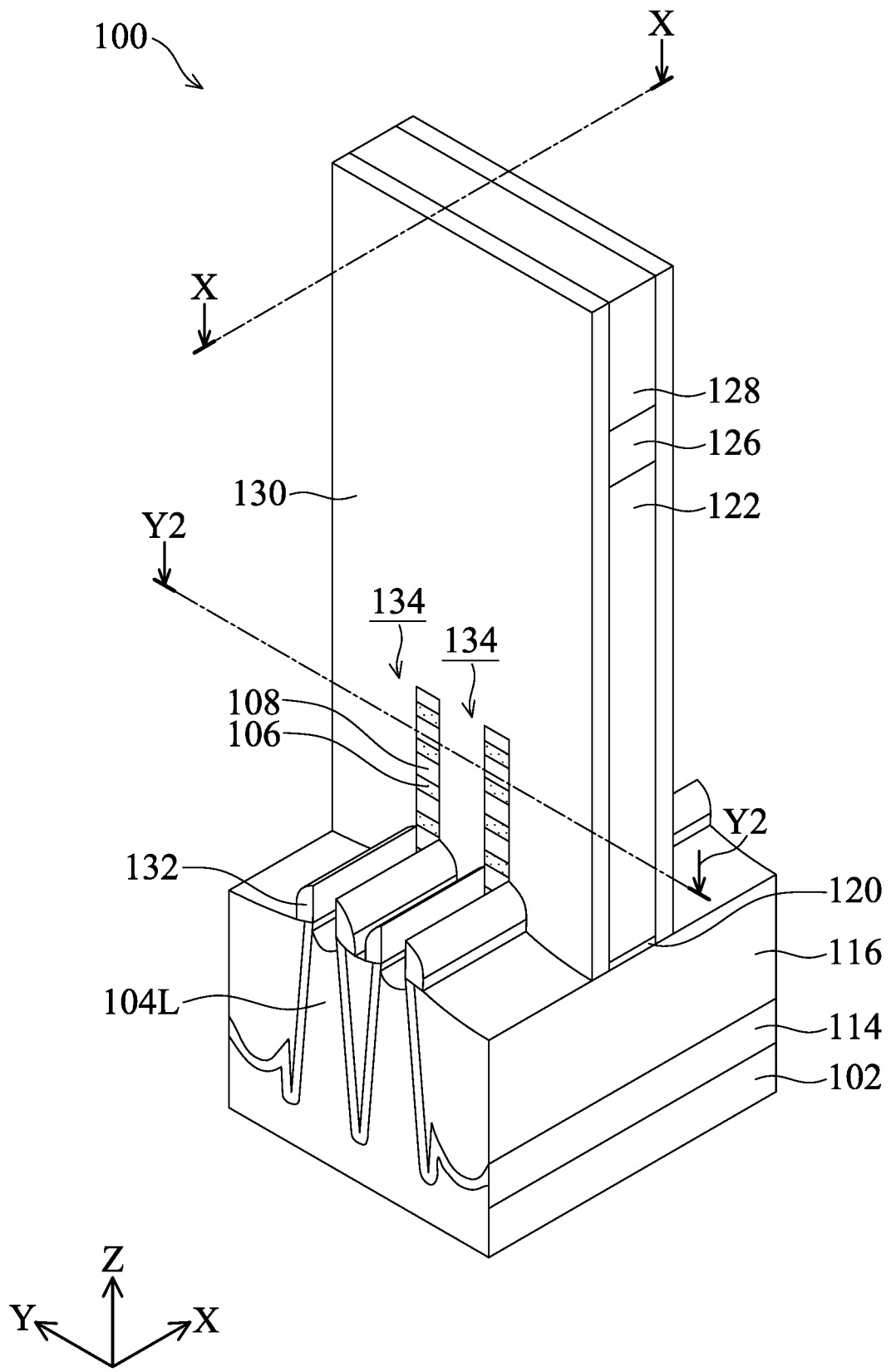
Figures 1, 1E, 2:
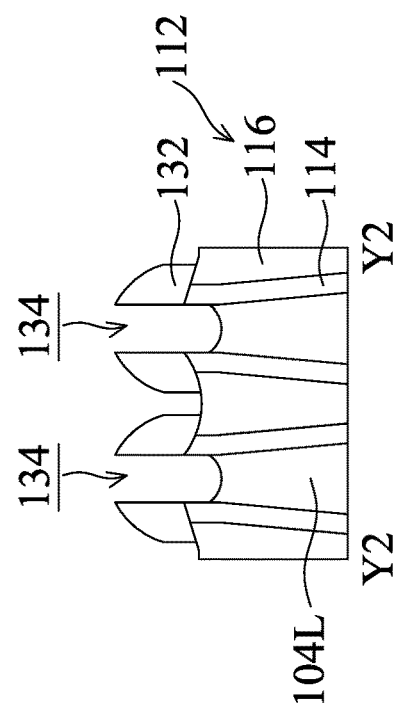
Figures 1, 1E:
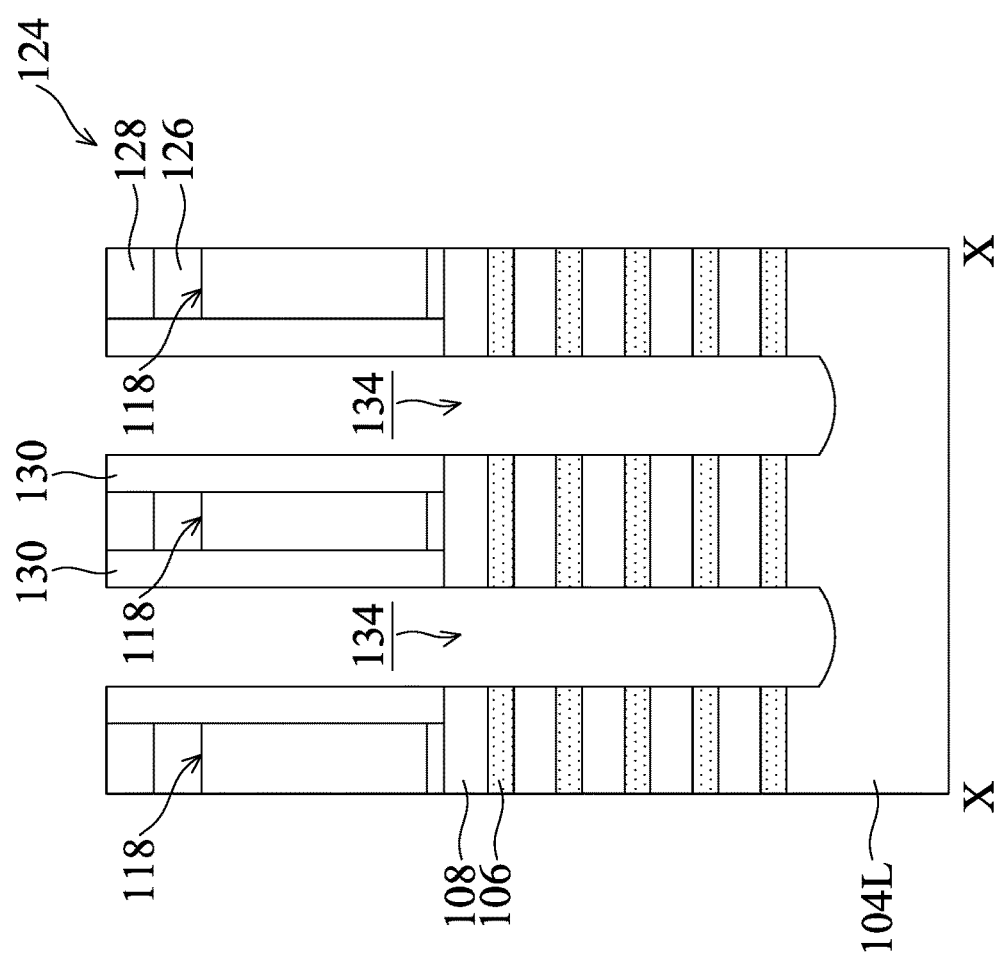

FIG. 1E is a perspective view illustrating the formation of a semiconductor device at an intermediate stage, in accordance with some embodiments of the disclosure;

FIGS. 1E-1 and 1E-2 are cross-sectional views of a semiconductor structure of FIG. 1E, in accordance with some embodiments of the disclosure.

Figure 1F:
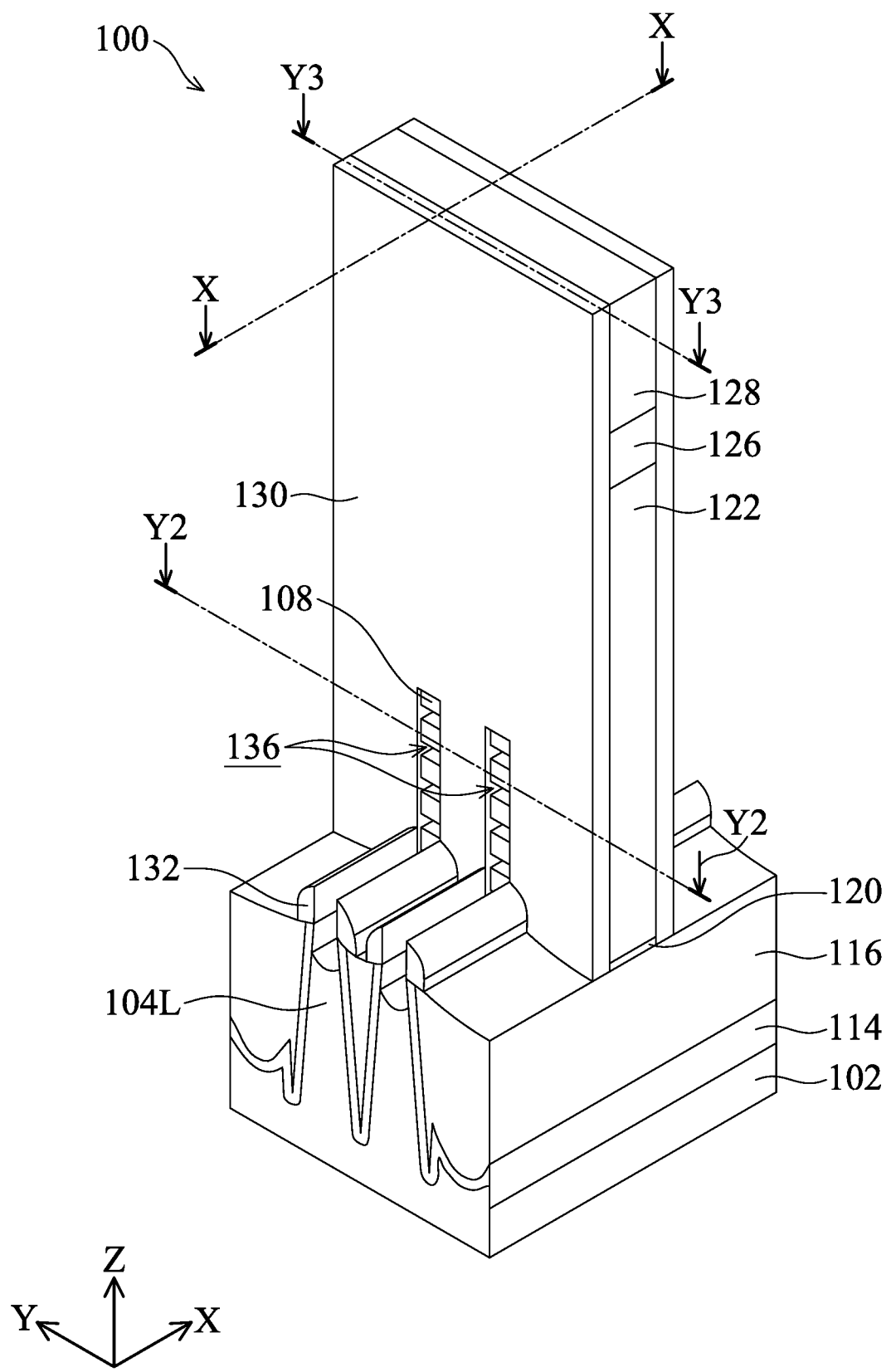
Figures 1, 1F, 2:
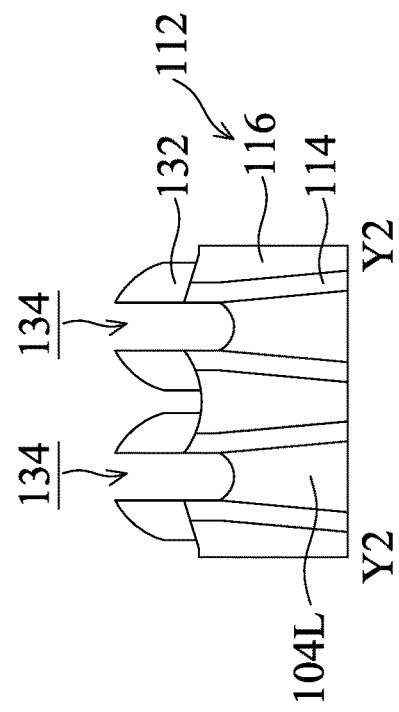
Figures 1, 1F:
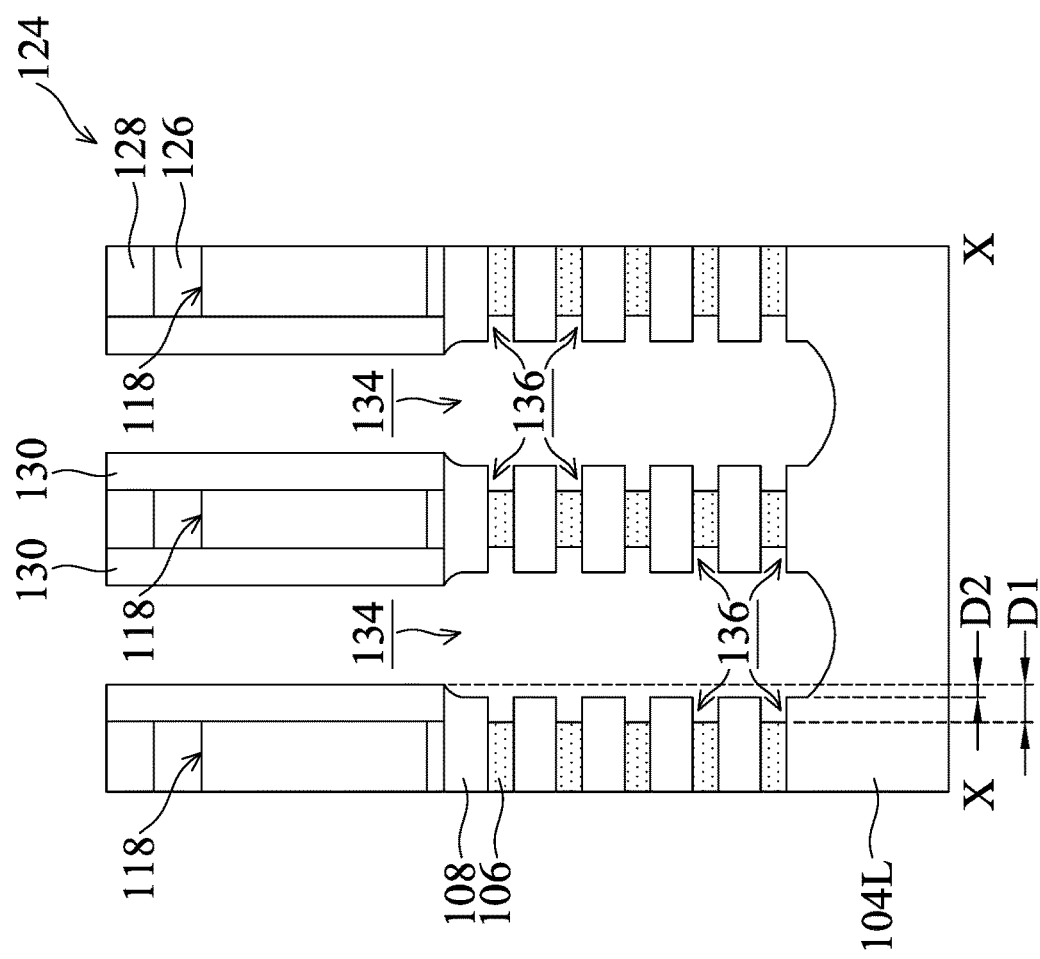
Figures 1, 1F, 2, 3:
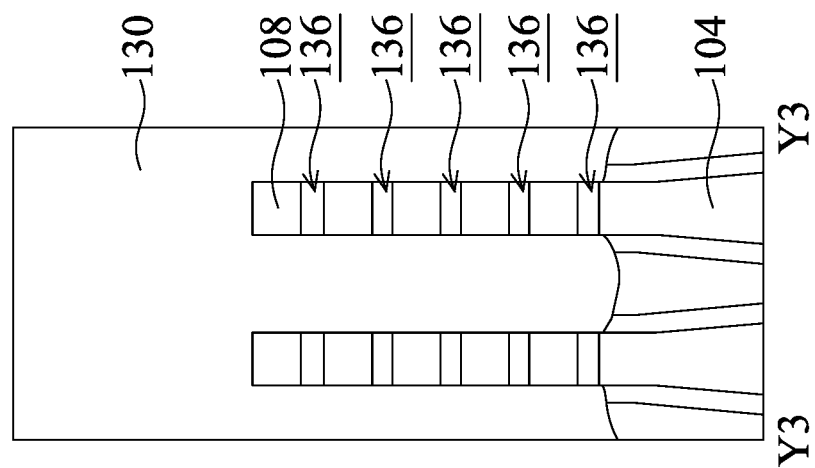

FIG. 1F is a perspective view illustrating the formation of a semiconductor device at an intermediate stage, in accordance with some embodiments of the disclosure; FIGS. 1F-1 through 1F-3 are cross-sectional views of a semiconductor structure of FIG. 1F, in accordance with some embodiments of the disclosure.

Figure 1G:
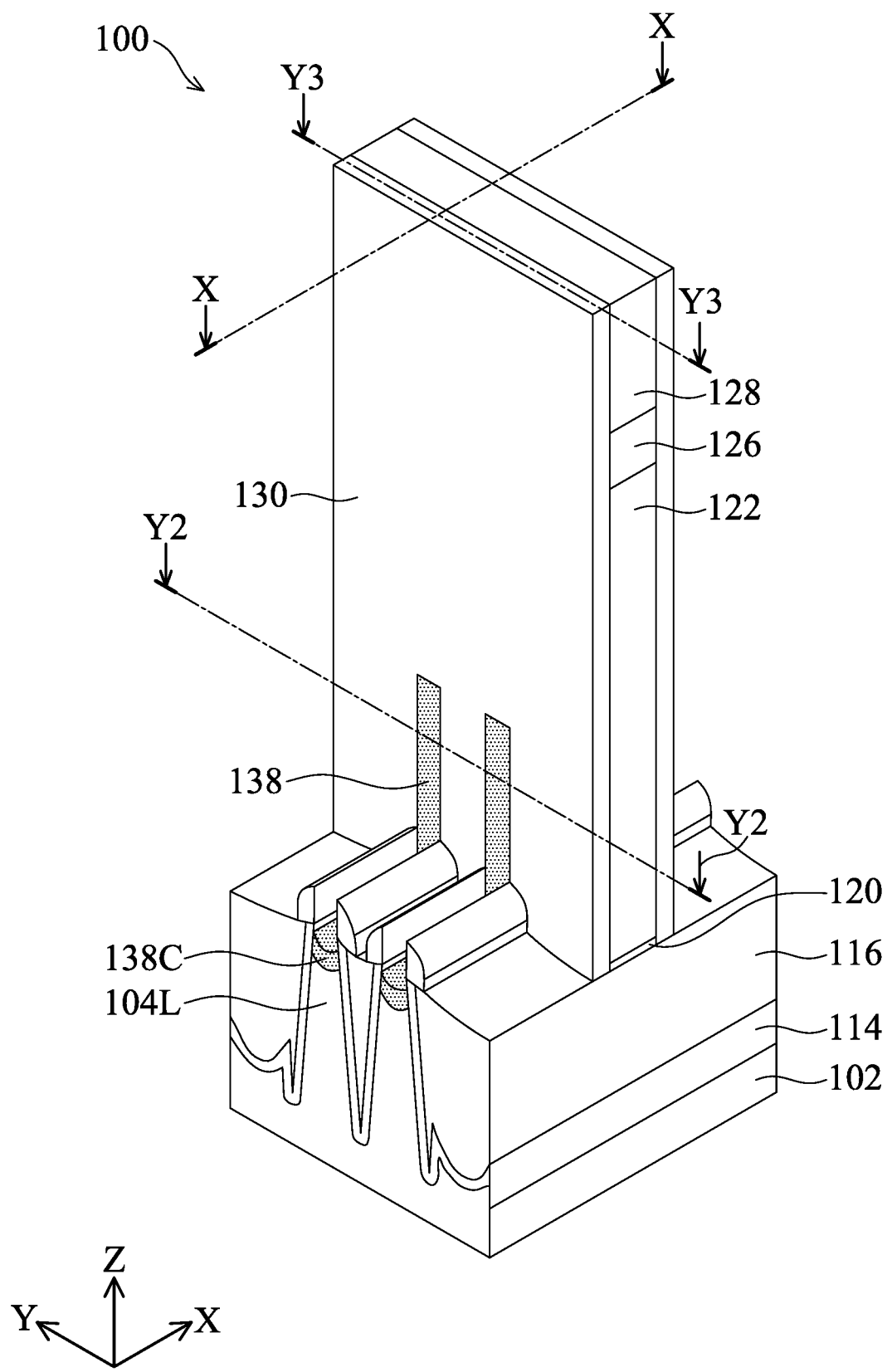
Figures 1, 1G:
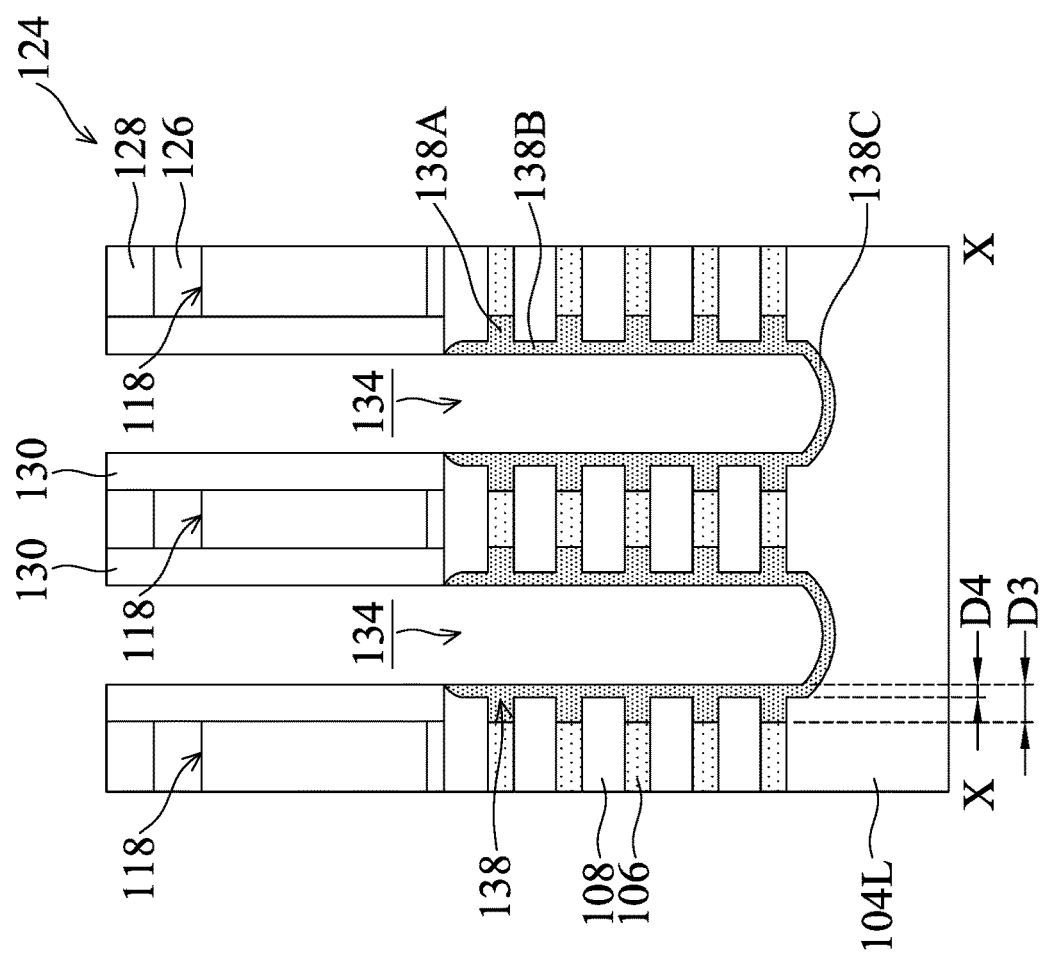
Figures 1, 1G, 2:
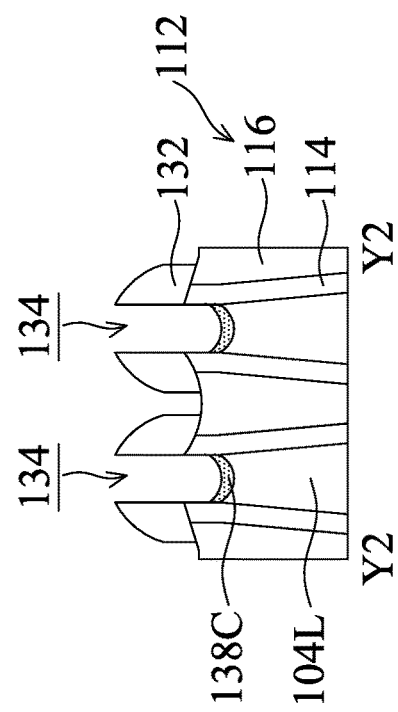
Figures 1, 1G, 2, 3:
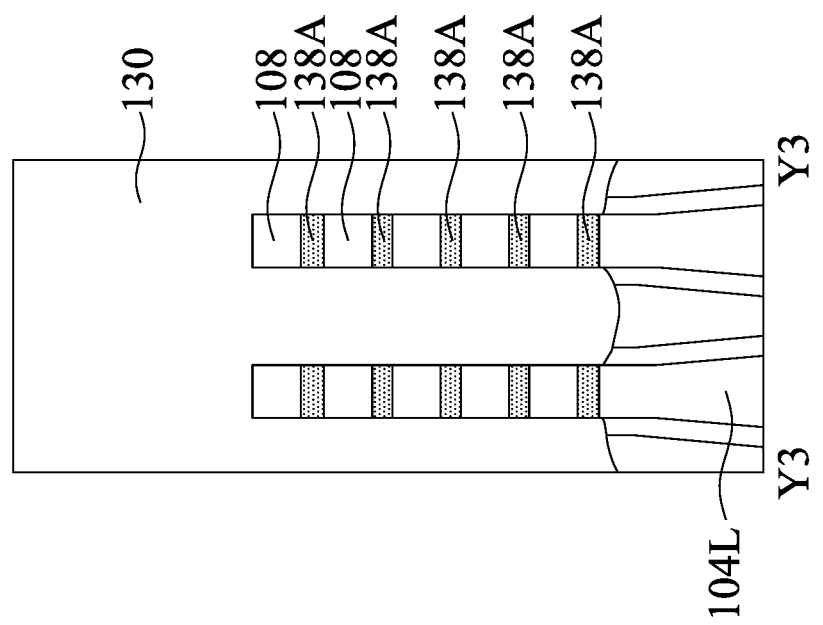

FIG. 1G is a perspective view illustrating the formation of a semiconductor device at an intermediate stage, in accordance with some embodiments of the disclosure;

FIGS. 1G-1 through 1G-3 are cross-sectional views of a semiconductor structure of FIG. 1G in accordance with some embodiments of the disclosure.

Figure 1H:
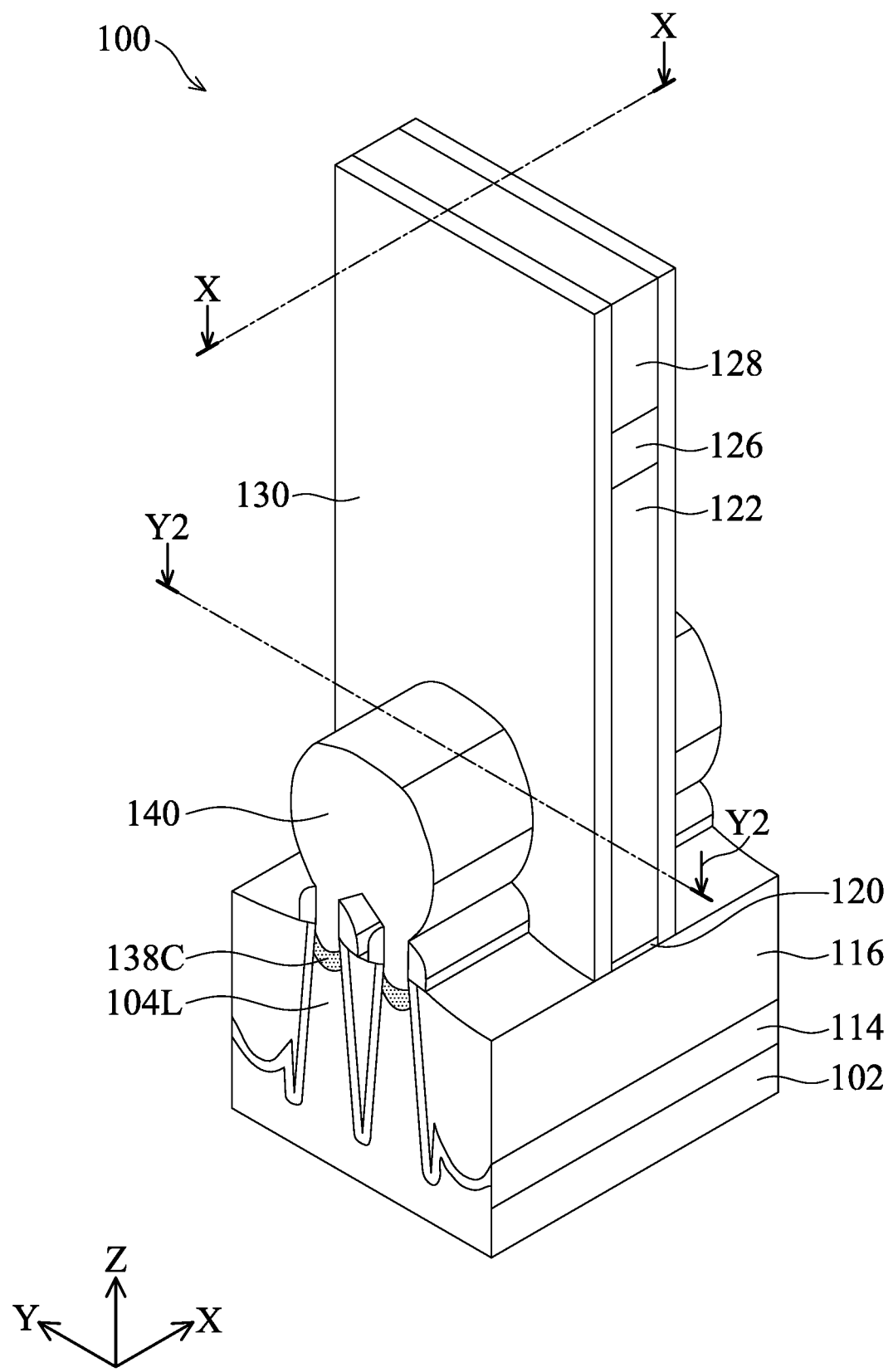

FIG. 1H is a perspective view illustrating the formation of a semiconductor device at an intermediate stage, in accordance with some embodiments of the disclosure; FIGS. 1H-1 and 1H-2 are cross-sectional views of a semiconductor structure of FIG. 1H, in accordance with some embodiments of the disclosure.

Figure 1I:
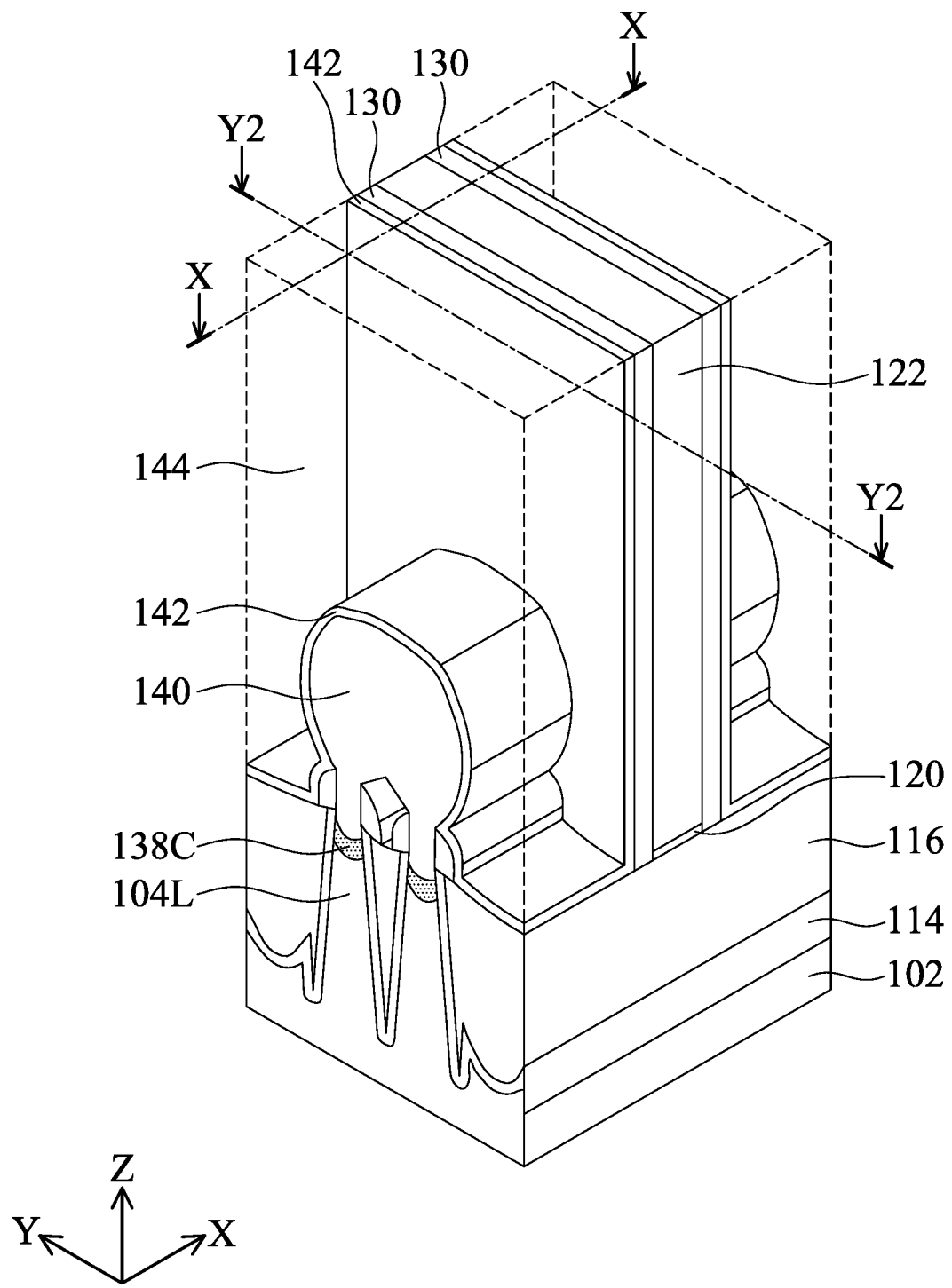
Figures 1, 1I, 2:
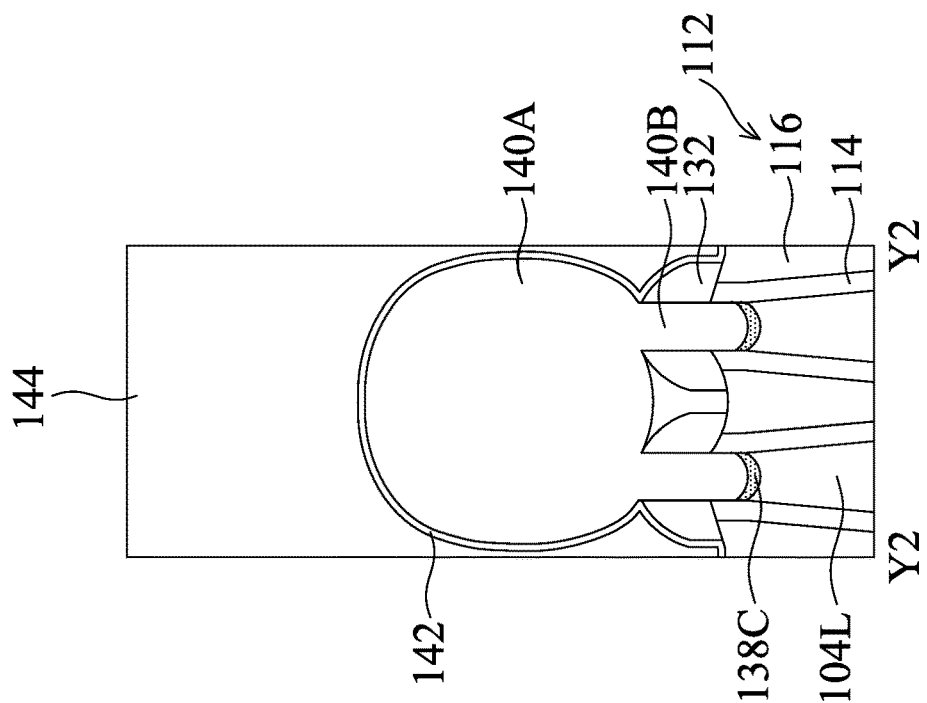
Figures 1, 1I:
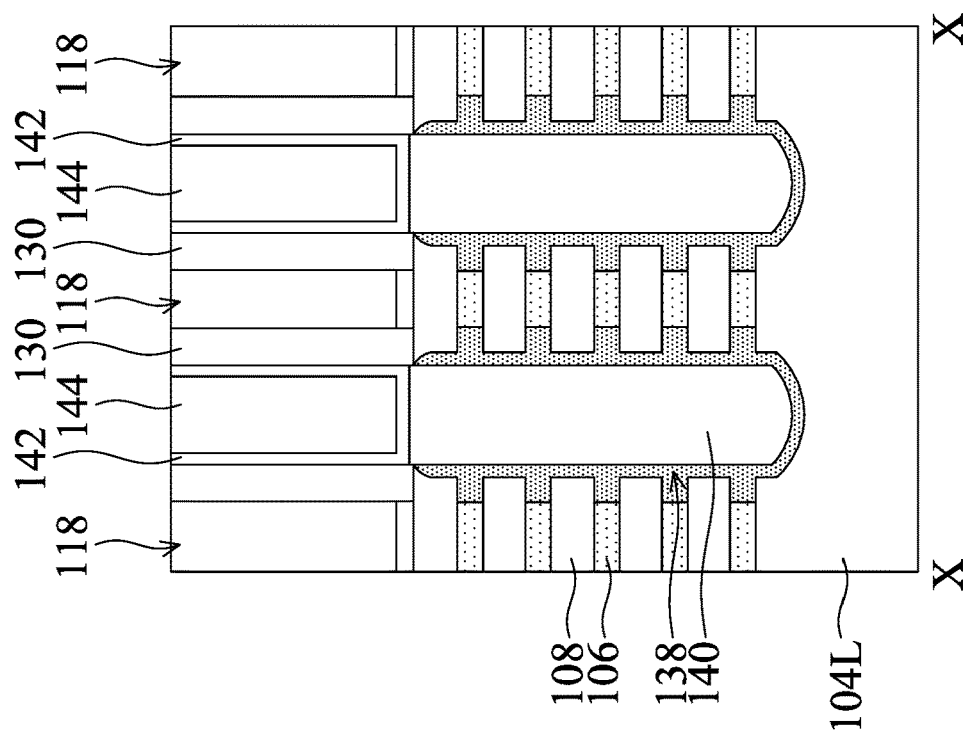

FIG. 1I is a perspective view illustrating the formation of a semiconductor device at an intermediate stage, in accordance with some embodiments of the disclosure; FIGS. 1I-1 and 1I-2 are cross-sectional views of a semiconductor structure of FIG. 1I, in accordance with some embodiments of the disclosure.

Figure 1J:
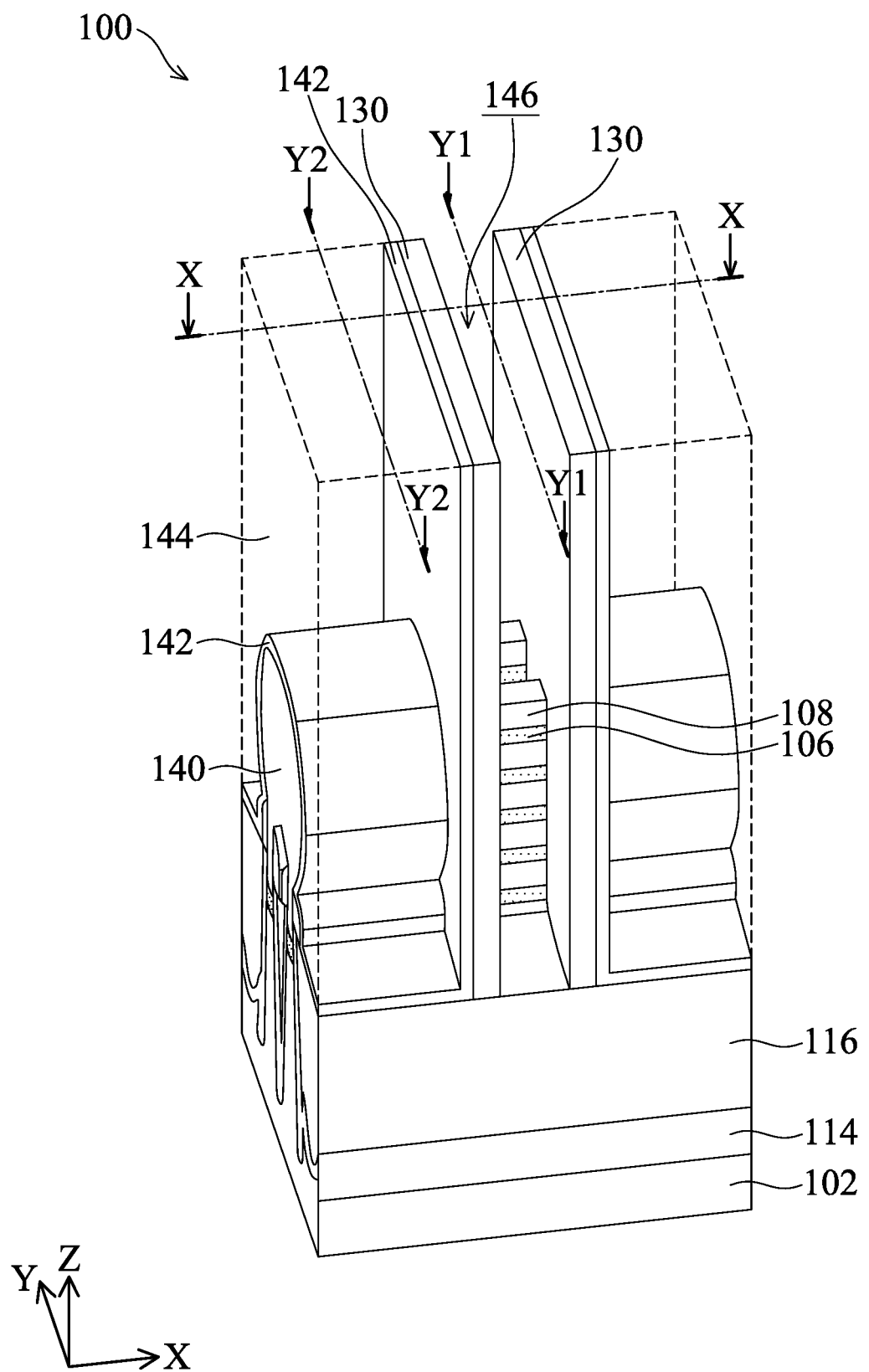
Figures 1, 1J, 2:
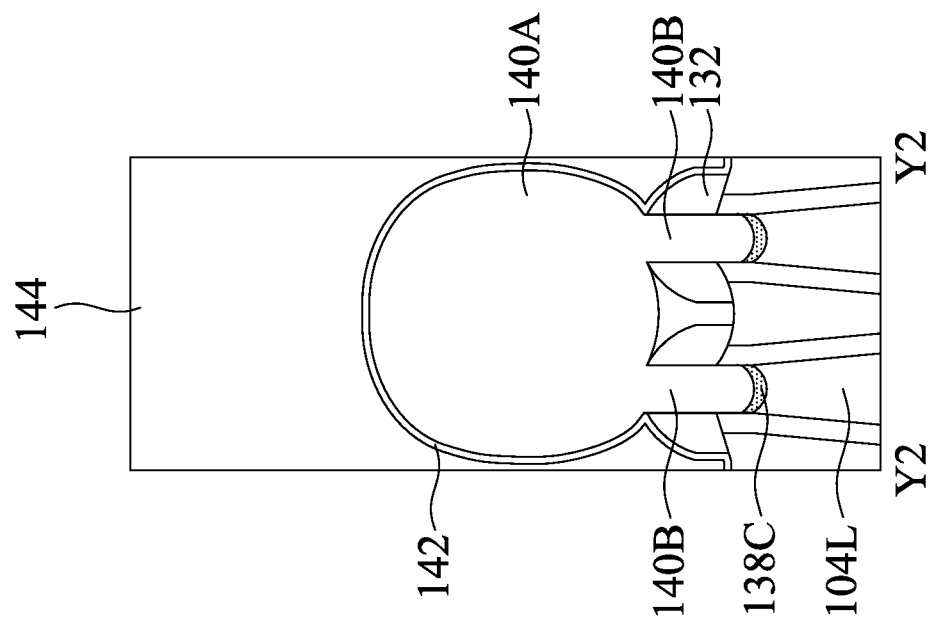
Figures 1, 1J:
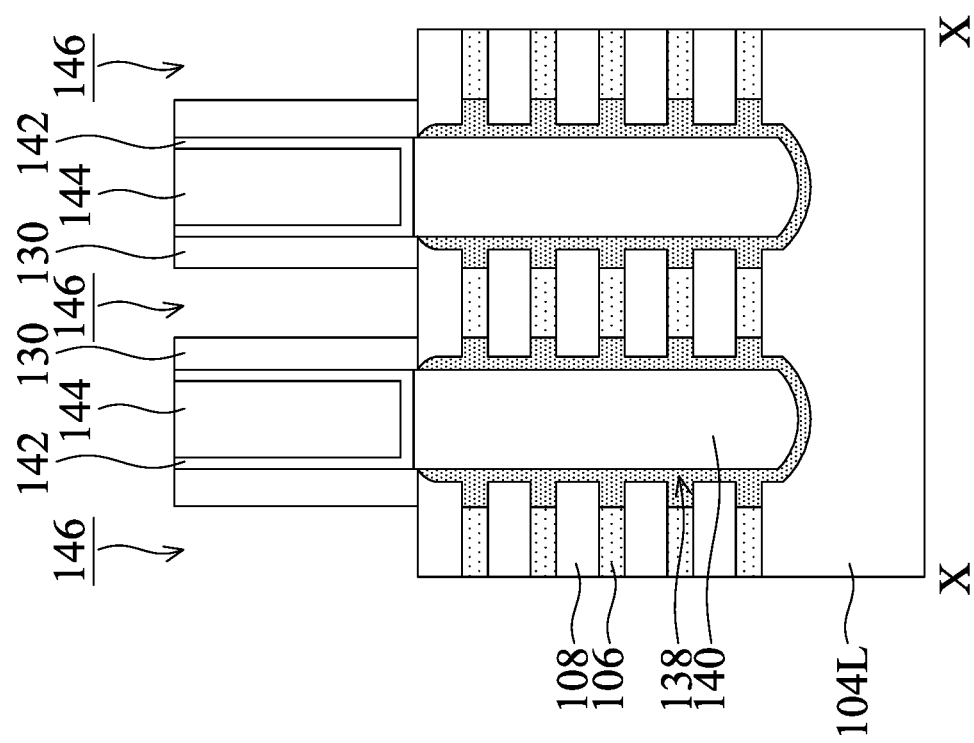
Figures 1, 1J, 2, 3:
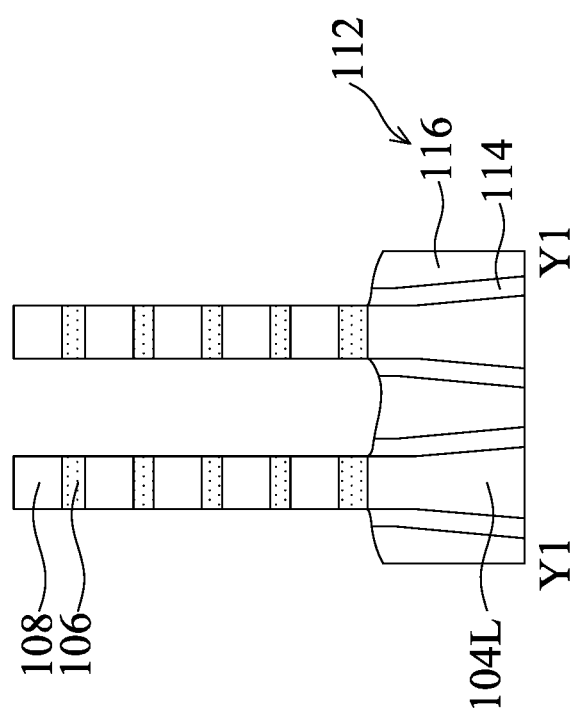

FIG. 1J is a perspective view illustrating the formation of a semiconductor device at an intermediate stage, in accordance with some embodiments of the disclosure; FIGS. 1J-1 through 1J-3 are cross-sectional views of a semiconductor structure of FIG. 1J, in accordance with some embodiments of the disclosure.

Figure 1K:
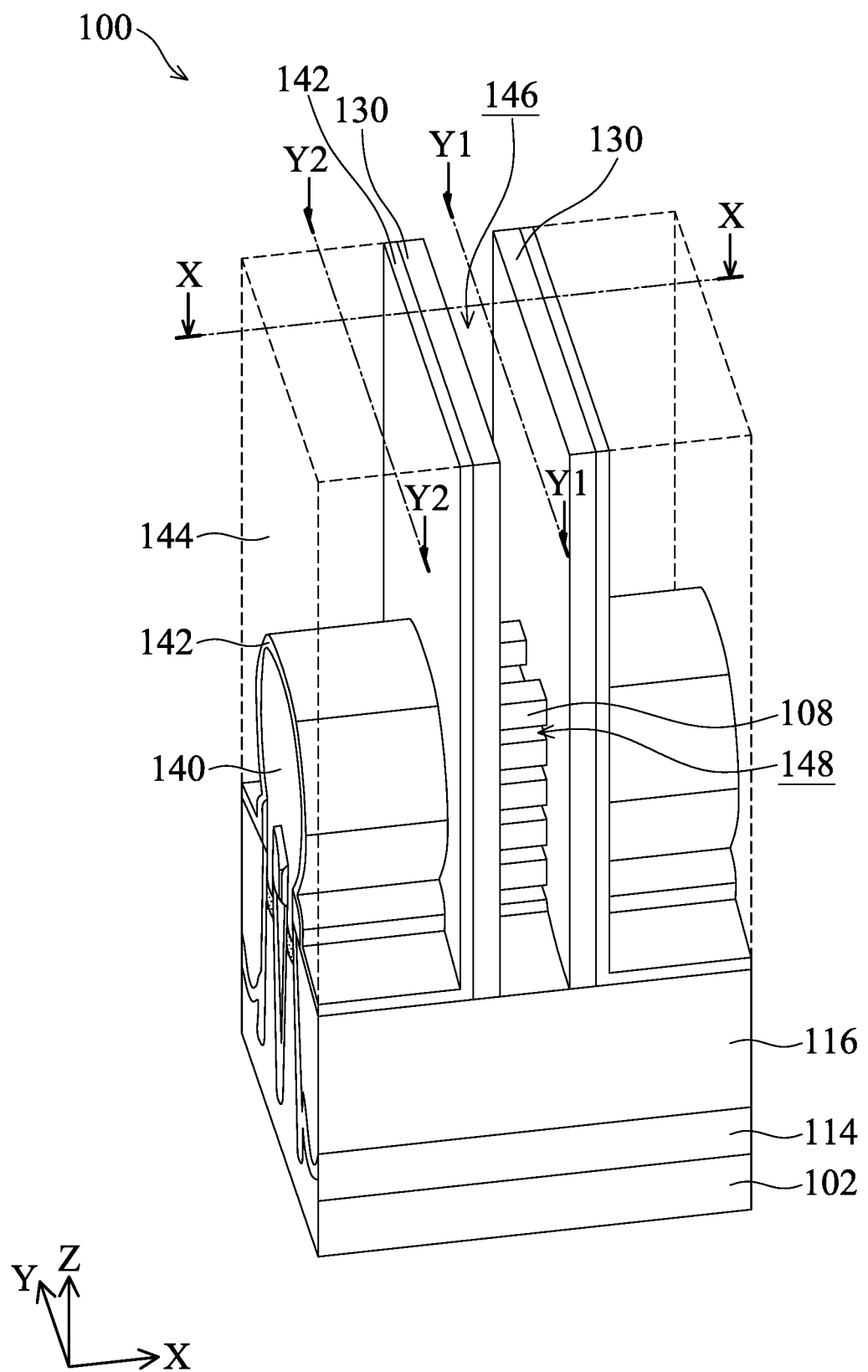
Figures 1, 1K, 2:
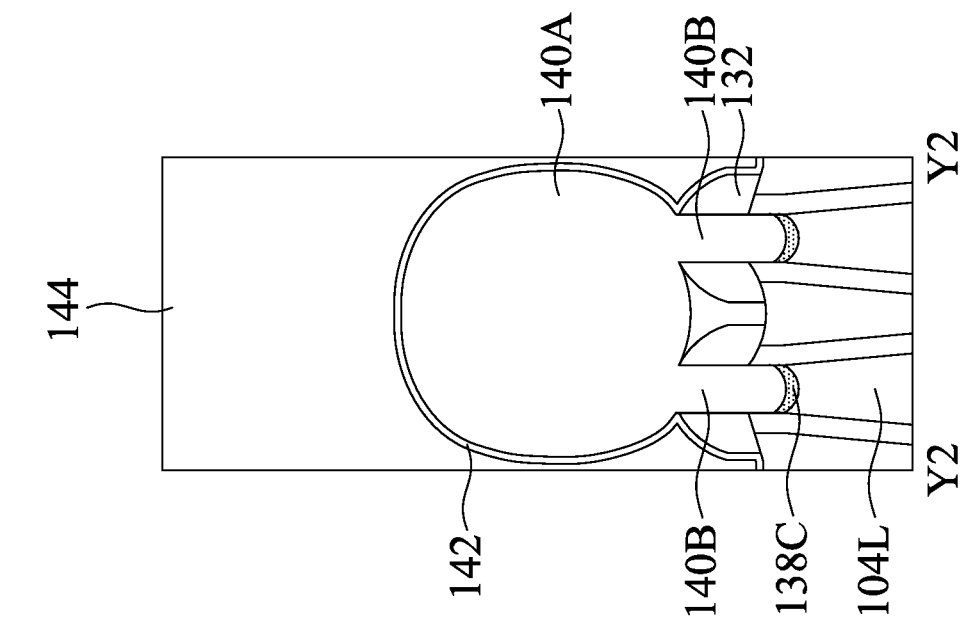
Figures 1, 1K:
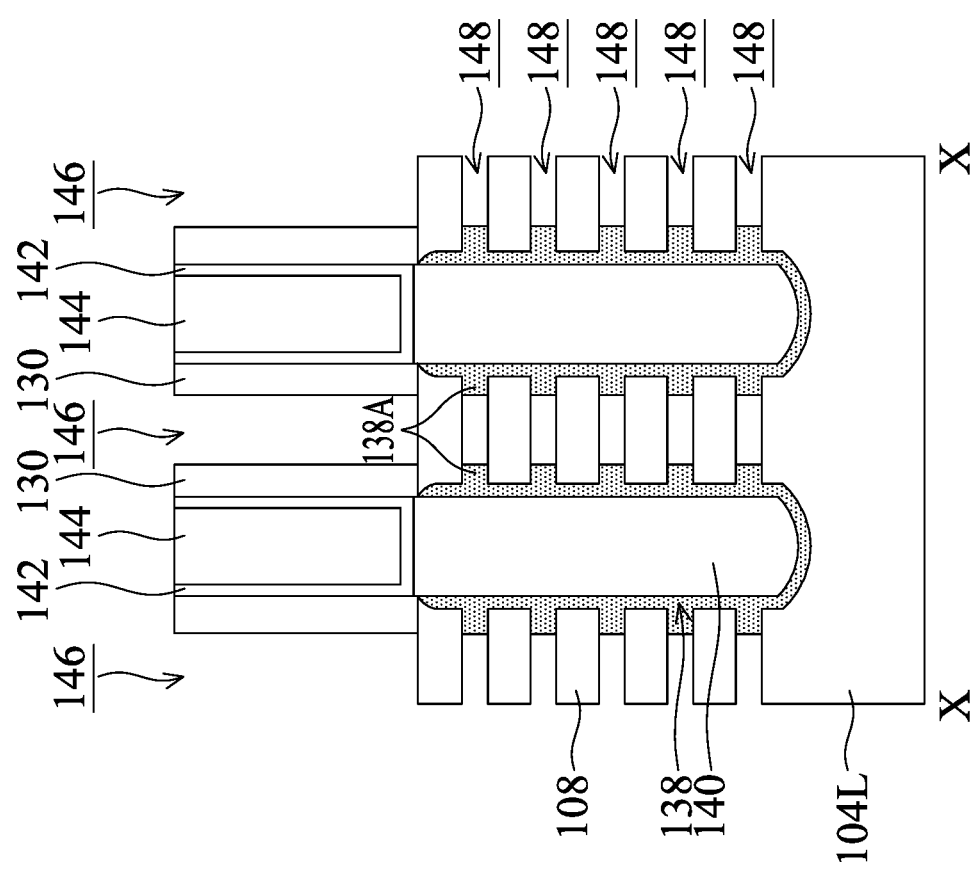
Figures 1, 1K, 2, 3:
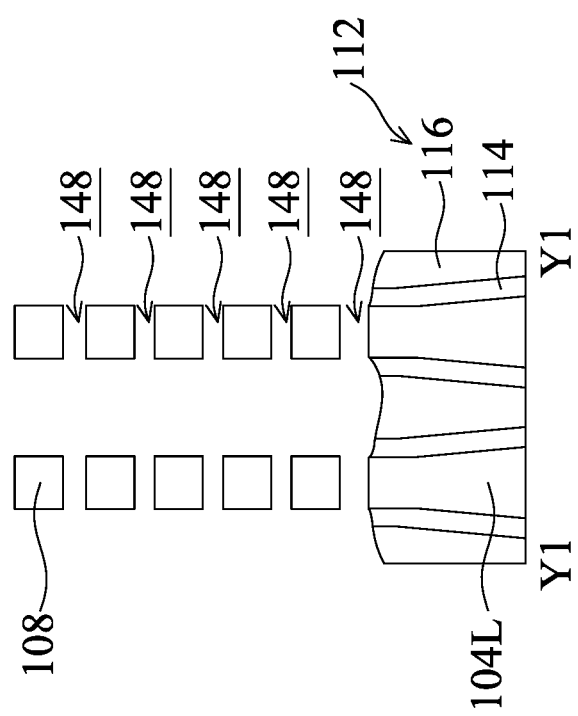

FIG. 1K is a perspective view illustrating the formation of a semiconductor device at an intermediate stage, in accordance with some embodiments of the disclosure; FIGS. 1K-1 through 1K-3 are cross-sectional views of a semiconductor structure of FIG. 1K, in accordance with some embodiments of the disclosure.

Figure 1L:
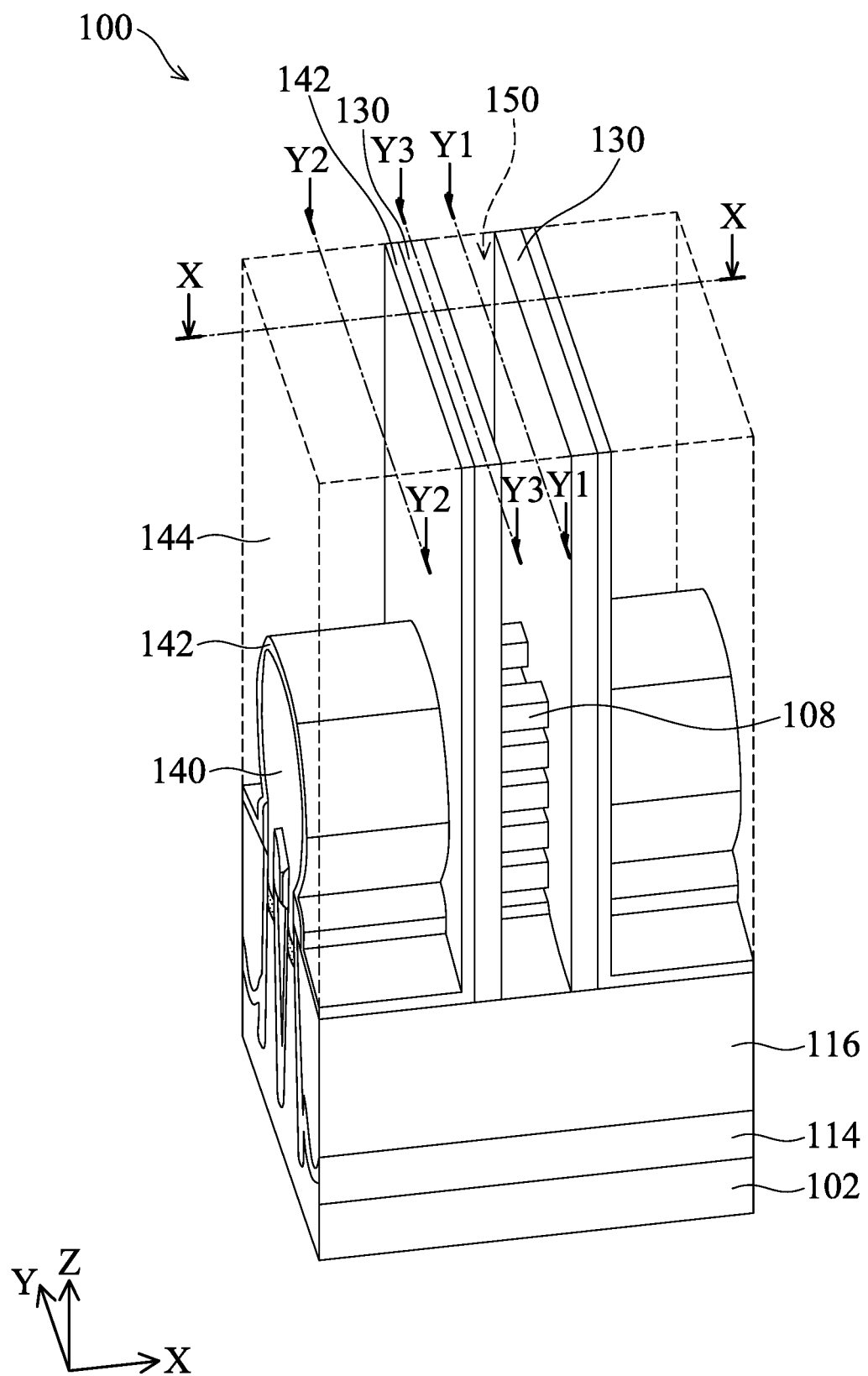
Figures 1, 1L, 2:
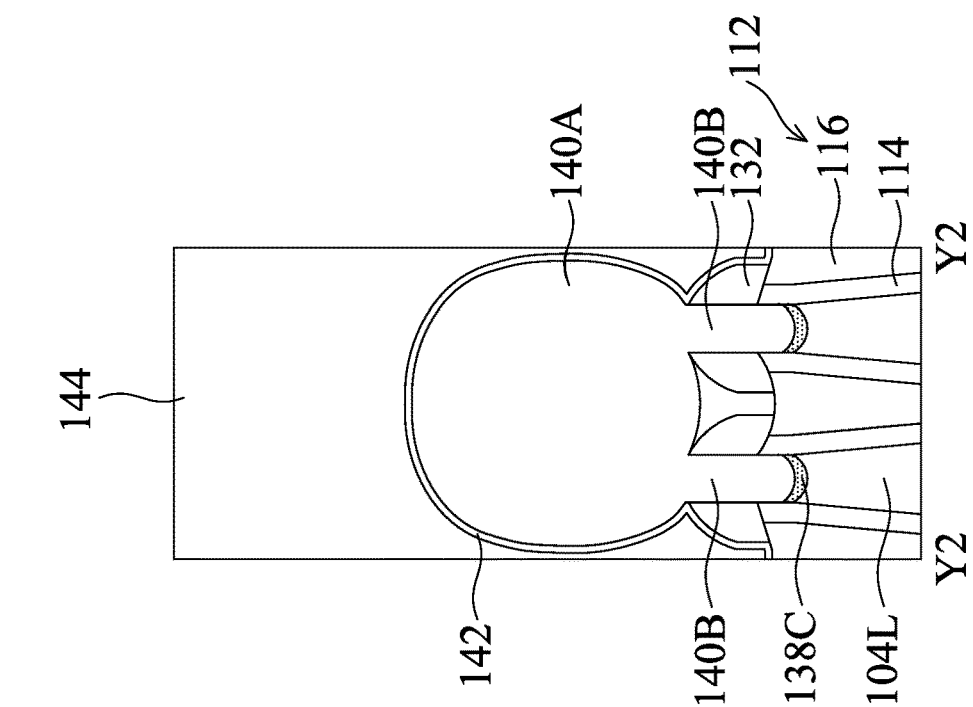
Figures 1, 1L:
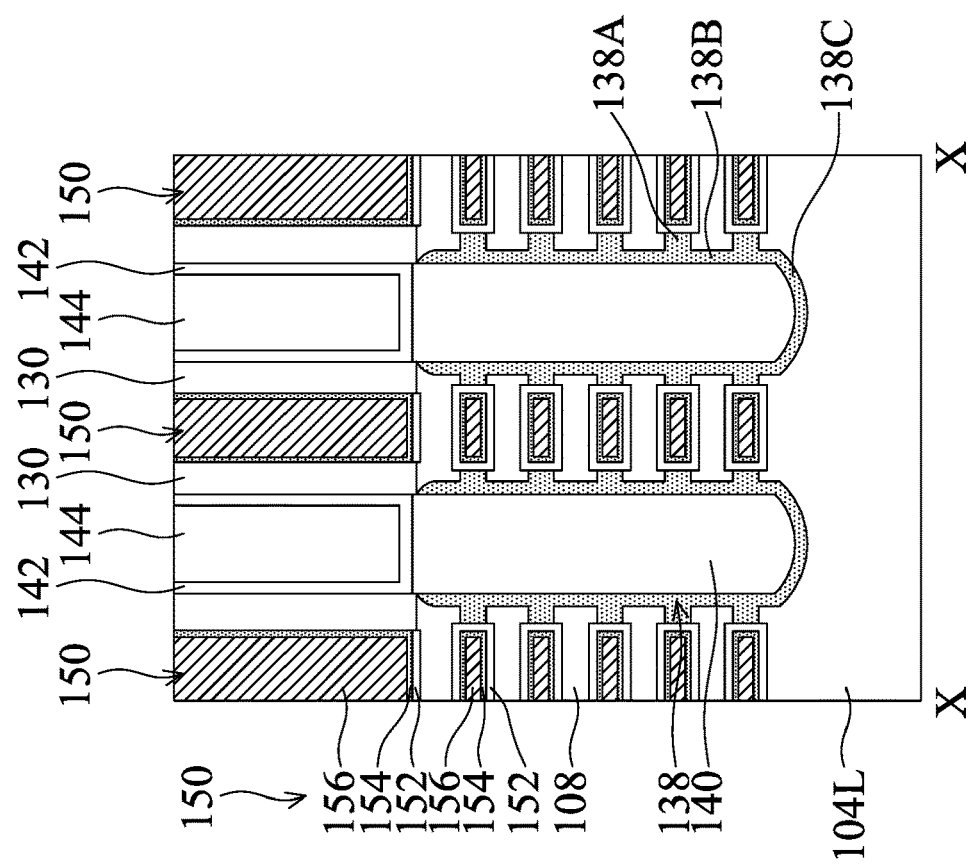
Figures 1, 1L, 2, 3, 4:
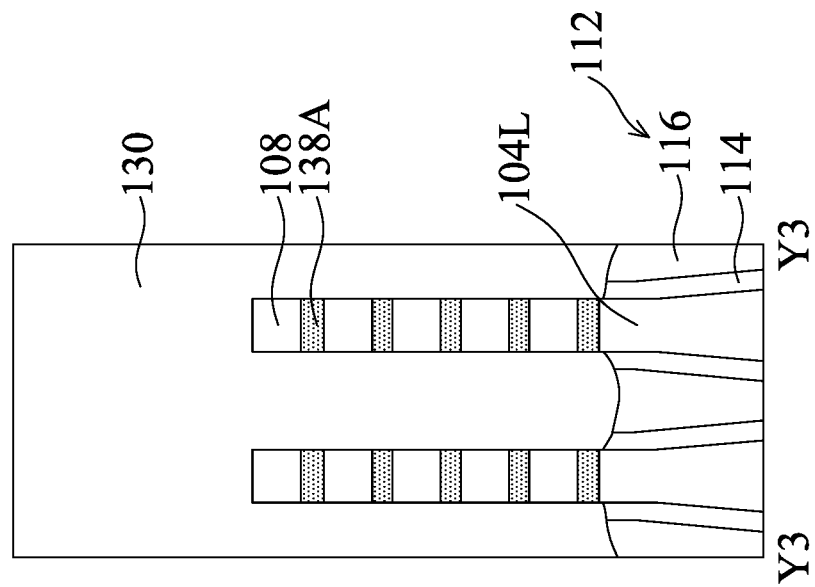
Figures 1, 1L, 2, 3:
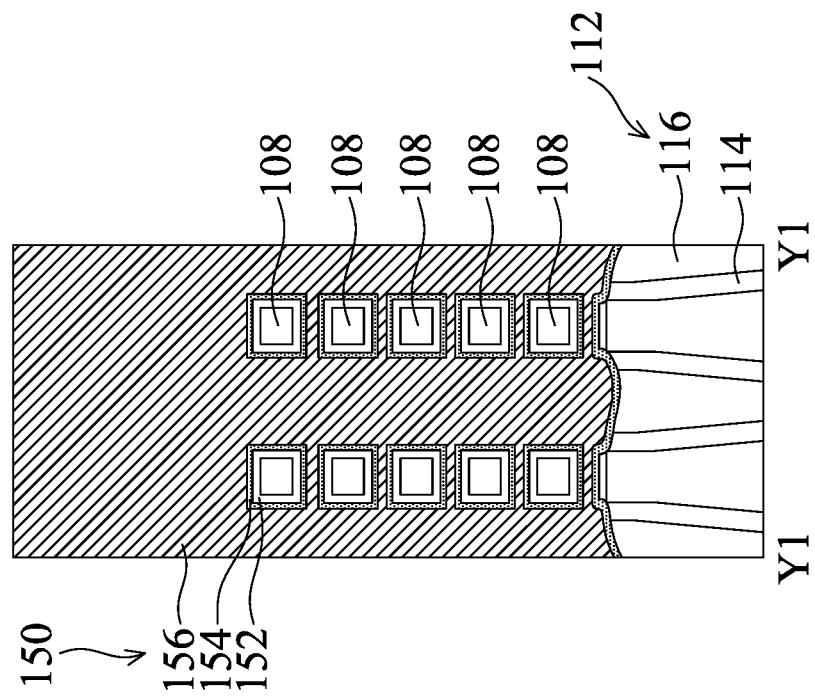
Figure 2:
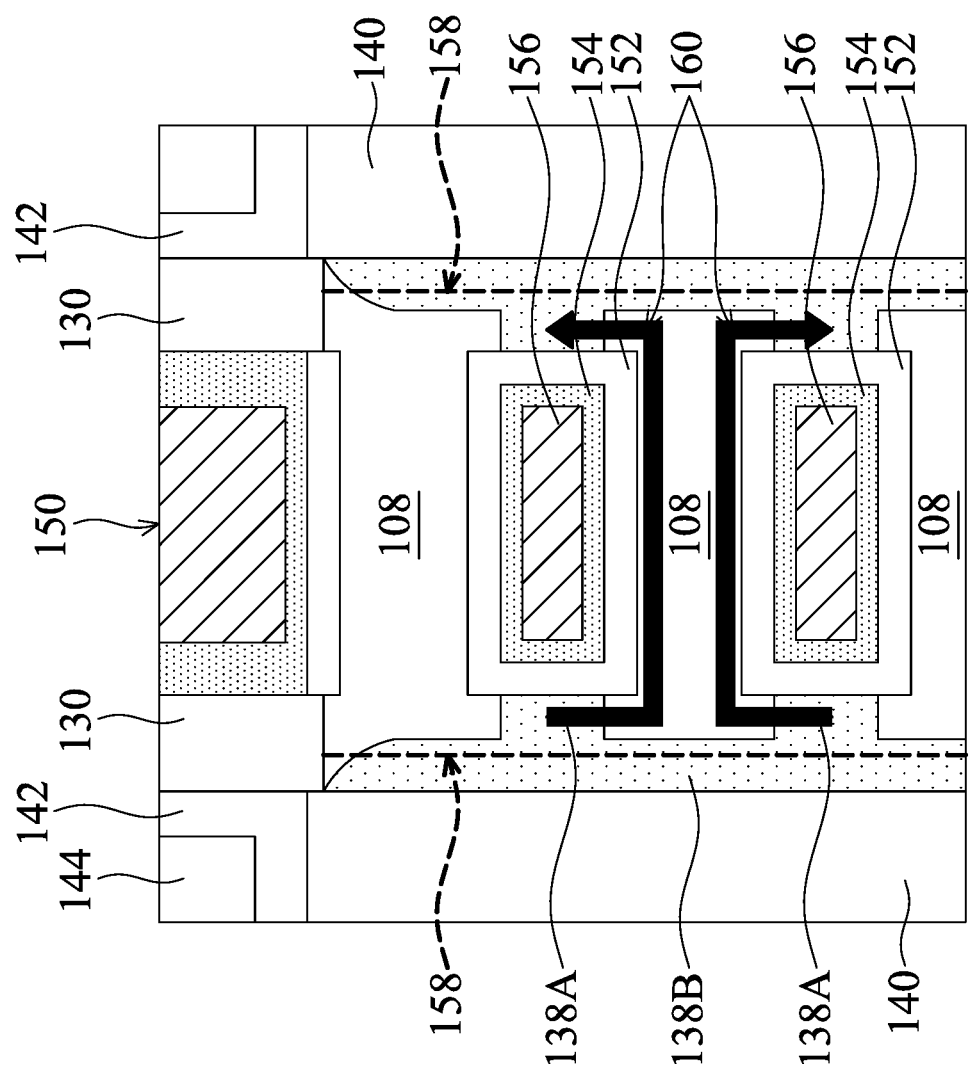

FIG. 1L is a perspective view illustrating the formation of a semiconductor device at an intermediate stage, in accordance with some embodiments of the disclosure; FIGS. 1L-1 through 1L-4 are cross-sectional views of a semiconductor structure of FIG. 1L, in accordance with some embodiments of the disclosure.

FIG. 2 is a partially enlarged view of the cross-sectional views of FIG. 1L-1 in accordance with some embodiments of the disclosure.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure are provided. The semiconductor structure may include a gate stack wrapping around a plurality of nanostructures and a source/drain feature adjacent to the plurality of nanostructures. The semiconductor structure also includes a semiconductor inner spacer layer interposing between the gate stack and the source/drain feature and interposing between the plurality of nanostructures and the source/drain feature. As a result, the source/drain features may be formed having a low density of crystalline defects, thereby straining or stressing the channel of the semiconductor device. Furthermore, the semiconductor inner spacer layer may be configured as a portion of the channel, and therefore the continued miniaturization of a semiconductor device may be achieved and the short channel effect may be improved.

FIG. 1A is a perspective view illustrating a semiconductor structure 100, in accordance with some embodiments. A semiconductor structure 100 is received or provided, as shown in FIG. 1A, in accordance with some embodiments. The semiconductor structure 100 includes a substrate 102 and a fin structure 104 over the substrate 102, in accordance with some embodiments.

For a better understanding of the semiconductor structure, X-Y-Z coordinate reference is provided in the figures of the present disclosure. X-axis and Y-axis are generally orientated along the lateral (or horizontal) directions that are parallel to the main surface of the substrate 102. Y-axis is transverse (e.g., substantially perpendicular) to the X-axis. Z-axis is generally oriented along the vertical direction that is perpendicular to the main surface of the substrate 102 (or the X-Y plane).

The fin structure 104 includes a lower fin element 104L formed from a portion of the substrate 102 and an upper fin element formed from an epitaxial stack including alternating first semiconductor layers 106 and second semiconductor layer 108, in accordance with some embodiments.

The fin structure 104 extends in X direction, in accordance with some embodiments. That is, the fin structure 104 has a longitudinal axis parallel to X direction, in accordance with some embodiments. The X direction may also be referred to as the channel-extending direction.

The fin structure 104 includes a channel region CH and source/drain regions SD, where the channel region CH is defined between the source/drain regions SD, in accordance with some embodiments. FIG. 1A shows one channel region CH and two source/drain regions SD for illustrative purpose and is not intended to be limiting. The number of the channel region CH and the source/drain region SD may be dependent on the semiconductor device design demand and/or performance consideration. Gate stack (not shown) will be formed with a longitudinal axis parallel to Y direction and extending across the channel region CH of the fin structure 104. As such, Y direction may also be referred to as a gate-extending direction.

In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (MP), indium arsenide (MAO, and/or indium antimonide (InSb), an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOT) structure, and/or have other suitable enhancement features.

An epitaxial stack including a first semiconductor material for the first semiconductor layers 106 and a second semiconductor material for the second semiconductor layers 108 is formed over the substrate 102. The first semiconductor material for the first semiconductor layers 106 have a different lattice constant than the second semiconductor material for the second semiconductor layers 108, in accordance with some embodiments. As such, the epitaxial stack is a superlattice structure including alternating first semiconductor layers 106 and second semiconductor layers 108, in accordance with some embodiments.

In some embodiments, the first semiconductor layers 106 have a different oxidation rate and/or etching selectivity than the second semiconductor layers 108. In some embodiments, the first semiconductor layers 106 are made of SiGe, where the percentage of germanium (Ge) in the SiGe is in a range from about 20 atomic % to about 50 atomic %, and the second semiconductor layers 108 are made of silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y. In some embodiments, the first semiconductor layers 106 and the second semiconductor layers 108 are formed using an epitaxial growth process such as molecular beam epitaxy (MBE), metal organic chemical vapor deposition (MOCVD), or vapor phase epitaxy (VPE), or another suitable technique.

As explained in detail below, the first semiconductor layers 106 will be removed, and the second semiconductor layers 108 form nanostructures (e.g., nanowire or nanosheet structures) that laterally extend between source/drain features and serve as the channel layers for the resulting transistors such as gate-all-around transistors, in accordance with some embodiments. As the term is used herein, "nanostructures" refers to semiconductor layers that have cylindrical shape, bar shaped and/or sheet shape. Gate stack (not shown) will be formed across and wrap around the nanostructures and interpose source/drain features, in accordance with some embodiments.

In some embodiments, the thickness (along Z direction) of each of the first semiconductor layers 106 is in a range from about 1.5 nm to about 20 nm. In some embodiments, the thickness (along Z direction) of each of the second semiconductor layers 108 is in a range from about 1.5 nm to about 20 nm.

The epitaxial stack including the first semiconductor material and the second semiconductor material and the underlying substrate 102 are then patterned into the fin structures 104, in accordance with some embodiments. In some embodiments, the patterning process includes forming a hard mask layer (not shown) over the epitaxial stack. The hard mask layer may include a pad oxide layer (made of such as a silicon oxide) and a nitride layer (made of such as a silicon nitride). A photolithography process is performed to form a patterned photoresist layer over the hard mask layer. An etching process such as dry plasma etching is performed to remove portions of the hard mask layer uncovered by the patterned photoresist layer, thereby forming a patterned hard mask layer (not shown).

An etching process is then performed to remove portions of the epitaxial stack and underlying substrate 102 uncovered by the patterned hard mask layer, thereby forming trenches 110 and the fin structure 104 protruding from between the trenches 110, in accordance with some embodiments. The etching process may be an anisotropic etching process, e.g., dry plasma etching.

The portion of the substrate 102 protruding from between the trenches 110 forms the lower fin element 104L of the fin structure 104, in accordance with some embodiments. A remainder of the epitaxial stack (including the first semiconductor layers 106 and second semiconductor layers 108) forms an upper fin element of the fin structure 104 over the lower fin element 104L.

FIG. 1B is a perspective view illustrating a semiconductor structure 100 after the formation of an isolation structure 112, in accordance with some embodiments of the disclosure. An isolation structure 112 is formed to surround the lower fin element 104L of the fin structure 104, as shown in FIG. 1B, in accordance with some embodiments. The isolation structure 112 includes a lining layer 114 and an insulting material 116 over the lining layer 114, in accordance with some embodiments.

The formation of the isolation structure 112 includes conformally forming a lining layer 114 over the semiconductor structure 100, in accordance with some embodiments. The lining layer 114 extends along and covers the upper surface of the substrate 102 and the upper surface and the sidewalls of the fin structure 104. In some embodiments, the lining layer 114 is made of dielectric material such as silicon oxide, silicon oxynitride, silicon nitride, another suitable material, and a combination thereof. In some embodiments, the lining layer 114 is deposited using CVD, atomic layer deposition (ALD), another suitable technique, and a combination thereof. In some embodiments, the lining layer 114 is grown using thermal oxidation.

An insulating material 116 is formed over the lining layer 114 and overfills the trenches 110, in accordance with some embodiments. In some embodiments, the insulating material 116 is made of silicon oxide, silicon nitride, silicon oxynitride (SiON), another suitable insulating material, multilayers thereof, and/or a combination thereof. In some embodiments, the insulating material 116 is deposited using includes CVD (such as LPCVD, PECVD, high density plasma CVD (HDP-CVD), high aspect ratio process (HARP), or flowable CVD (FCVD)), ALD, another suitable technique, and/or a combination.

A planarization process is performed on the semiconductor structure 100 to remove portions of the insulating material 116 and the lining layer 114 above the patterned hard mask layer (not shown) until upper surface of the patterned hard mask layer is exposed, in accordance with some embodiments. The planarization may be chemical mechanical polishing (CMP). One or more etching process is then performed to remove the patterned hard mask layer, in accordance with some embodiments. After the etching process, the top surface of the fin structure 104 is exposed, in accordance with some embodiments.

The insulating material 116 and the lining layer 114 are recessed by an etching process (such as dry plasma etching and/or wet chemical etching) until the upper fin element (including the first semiconductor layers 106 and the second semiconductor layers 108) of the fin structure 104 is exposed, in accordance with some embodiments. The recessed insulating material 116 and the recessed lining layer 114 are collectively referred to as an isolation structure 112.

The isolation structure 112 is configured to electrically isolate active regions (e.g., the fin structure 104) of the semiconductor structure 100 and is also referred to as shallow trench isolation (STI) feature, in accordance with some embodiments. A recessing depth may be controlled (e.g., by controlling an etching time) so as to result in a desired height of the exposed portion of the fin structure 104. For example, a portion of the lower fin element 104L may be exposed from the isolation structure 112.

FIG. 1C is a perspective view illustrating a semiconductor structure 100 after the formation of a dummy gate structure 118, in accordance with some embodiments. FIGS. 1C-1 and 1C-2 are cross-sectional views of the semiconductor structure 100 of FIG. 1C taken along lines X-X and Y1-Y1, in accordance with some embodiments.

A dummy gate structure 118 is formed over the semiconductor structure 100, as shown in FIGS. 1C, 1C-1 and 1C-2, in accordance with some embodiments. In some embodiments, the dummy gate structure 118 extends in Y direction. That is, the dummy gate structure 118 has a longitudinal axis parallel to Y direction, in accordance with some embodiments. The dummy gate structure 118 extends across and wraps the channel region of the fin structure 104, in accordance with some embodiments.

The dummy gate structure 118 includes a dummy gate dielectric layer 120 and a dummy gate electrode layer 122 formed over the dummy gate dielectric layer 120, as shown in FIGS. 1C, 1C-1 and 1C-2, in accordance with some embodiments. In some embodiments, the dummy gate dielectric layer 120 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is deposited using ALD, CVD, thermal oxidation, physical vapor deposition (PVD), another suitable technique, and/or a combination thereof.

In some embodiments, the dummy gate electrode layer 122 is made of a conductive material such as a semiconductor material such as polysilicon, poly-silicon germanium, and/or a combination thereof. In some embodiments, the dummy gate electrode layer 122 is deposited using CVD, another suitable technique, and/or a combination thereof.

In some embodiments, the formation of the dummy gate structure 118 includes conformally depositing a dielectric material for the dummy gate dielectric layer 120 over the semiconductor structure 100, depositing a conductive material for the dummy gate electrode layer 122 over the dielectric material, planarizing the conductive material, and patterning the conductive material and dielectric material into the dummy gate structure 118.

The patterning process includes forming a patterned hard mask layer 124 over the conductive material to cover the channel region of the fin structure 104, in accordance with some embodiments. In some embodiments, the patterned hard mask layer 124 is a multilayer structure including a nitride layer (e.g., silicon nitride) 126 and an oxide layer (silicon oxide) 128 over the nitride layer 126. The conductive material and dielectric material, uncovered by the patterned hard mask layer 124, are etched away to expose the source/drain regions of the fin structure 104 until the isolation structure 112 is exposed, in accordance with some embodiments.

FIG. 1D is a perspective view illustrating a semiconductor structure 100 after the formation of gate spacer layers 130 and fin spacer layers 132, in accordance with some embodiments. FIGS. 1D-1 and 1D-2 are cross-sectional views of the semiconductor structure 100 of FIG. 1D taken along lines X-X and Y1-Y1, in accordance with some embodiments.

Gate spacer layers 130 are formed along and cover opposite sidewalls of the dummy gate structure 118, as shown in FIGS. 1D and 1D-1, in accordance with some embodiments. The gate spacer layers 130 are configured to offset subsequently formed source/drain features, separate source/drain features from the dummy gate structure 118, and support the dummy gate structure 118, in accordance with some embodiments.

Fin spacer layers 132 are formed along and cover opposite sidewalls of the source/drain regions of the fin structure 104, as shown in FIG. 1D, in accordance with some embodiments. The gate spacer layers 130 are configured to constrain a lateral growth of subsequently formed source/drain features and support the fin structure 104, in accordance with some embodiments.

The gate spacer layers 130 and the fin spacer layers 132 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacer layers 130 and the fin spacer layers 132 includes conformally depositing a dielectric material for the gate spacer layers 130 and the fin spacer layers 132 over the semiconductor structure 100 followed by an anisotropic etching process such as dry plasma etching.

In some embodiments, the anisotropic etching process removes horizontal portions of the dielectric material formed along the upper surface of the patterned hard mask layer 124, along the exposed upper surface of the fin structure 104, and along the upper surface of the isolation structure 112. After the etching process, vertical portions of the dielectric material leaving on the sidewalls of the dummy gate structure 118 act as the gate spacer layers 130, in accordance with some embodiments. Vertical portions of the dielectric material leaving on the sidewalls of the source/drain regions of the fin structure 104 act as the fin spacer layers 132, in accordance with some embodiments. FIG. 1E is a perspective view illustrating a semiconductor structure 100 after the formation of source/drain recesses 134, in accordance with some embodiments. FIGS. 1E-1 and 1E-2 are cross-sectional views of the semiconductor structure 100 of FIG. 1E taken along lines X-X and Y2-Y2, in accordance with some embodiments.

The source/drain regions of the tin structure 104 is recessed using an etching process, thereby forming first source/drain recesses 134 through the first fin structure 104, as shown in FIGS. 1E, 1E-1, 1E-2, in accordance with some embodiments. The etching process may be anisotropic etching process, e.g., dry plasma etching, and uses the dummy gate structure 118 along with the gate spacer layers 130 as etching masks.

A recessing depth may be dependent on a desired height of the source/drain features for performance consideration. In some embodiments, the etching process etches away the upper fin element (including the first semiconductor layers 106 and the second semiconductor layer 108) of the fin structure 104 at source/drain region. In some embodiments, the bottom surfaces of the recesses 134 are located at a lower level than the upper surface of the isolation structure 112. The etching process also recesses the fin spacer layers 132, in accordance with some embodiments.

FIG. 1F is a perspective view illustrating a semiconductor structure 100 after the formation of notches 136, in accordance with some embodiments. FIGS. 1F-1, 1F-2 and 1F-3 are cross-sectional views of the semiconductor structure 100 of FIG. 1F taken along lines X-X, Y2-Y2 and Y3-Y3, in accordance with some embodiments.

An etching process is performed on the semiconductor structure 100 to laterally recess the upper fin element of the fin structure 104 from the source/drain recesses 134, in accordance with some embodiments. In some embodiments, in the etching process, the first semiconductor layers 106 have a greater etching rate (or etching amount) than the second semiconductor layers 108, thereby forming notches 136 between adjacent second semiconductor layers 108 and the bottommost semiconductor layer 108 and the lower fin element 104L, as shown in FIGS. 1F and 1F-1, in accordance with some embodiments. In some embodiments, the etching process is an isotropic etching such as dry chemical etching, remote plasma etching, wet chemical etching, another suitable technique, and/or a combination thereof.

In some embodiments, first semiconductor layers 106 are laterally recessed to a first distance D1 (along X direction) in a range from about 2 nm to about 7 nm. In some embodiments, second semiconductor layers 108 are laterally recessed to a second distance D2 (along X direction) in a range from about 0.5 nm to about 3.5 nm. In some embodiments, the first distance D1 is less than the second distance D2. In some embodiments, a ratio of the second distance D2 to the first distance D1 is in a range from about 0.1 to about 0.5.

An oxidization process may be performed before the etching process, thereby further increasing the difference in etching selectivity between the first semiconductor layers 106 and the second semiconductor layers 108.

FIG. 1G is a perspective view illustrating a semiconductor structure 100 after the formation of a third semiconductor layer 138, in accordance with some embodiments. FIGS. 1G-1, 1G-2 and 1G-3 are cross-sectional views of the semiconductor structure 100 of FIG. 1G taken along lines X-X, Y2-Y2 and Y3-Y3, in accordance with some embodiments.

A third semiconductor layer 138 is formed on the exposed surfaces of the fin structure 104, as shown in FIGS. 1G, 1G-1, and 1G-3, in accordance with some embodiments. The semiconductor inner spacer layer 138 is selectively grown from the exposed semiconductor surfaces of first semiconductor layers 106 and the second semiconductor layers 108 of the fin structure 104 and the lower fin elements 104L using an epitaxial growth process, in accordance with some embodiments. The epitaxial growth process may be MBE, MOCVD, or VPE, another suitable technique, or a combination thereof.

The third semiconductor layer 138 includes a first portion 138A grown from the exposed surfaces of the first semiconductor layer 106 to overfill the notches 136, in accordance with some embodiments. The semiconductor inner spacer layer 138 also includes a second portion 138B grown from the exposed surfaces of the second semiconductor layers 108, in accordance with some embodiments. The first portion 138A and the second portion 138B of the third semiconductor layer 138 extend below and are aligned with the gate spacer layers 130, in accordance with some embodiments. The semiconductor inner spacer layer 138 also includes a third portion 138C grown from the exposed upper surface of the lower fin elements 104L (i.e., the bottom surfaces of the source/drain recesses 134), in accordance with some embodiments.

The third semiconductor layer 138 is also referred as to a semiconductor inner spacer layer, in accordance with some embodiments. The semiconductor inner spacer layer 138 is configured as a vertical portion of a channel of the resulting transistor and an etching stop layer in a subsequently channel releasing process, and/or configured to mitigate or eliminate the crystalline defects (such as stacking fault and/or dislocation) formed in the subsequently formed source/drain feature.

In some embodiments, the first portion 138A of the semiconductor inner spacer layer 138 has a first width D3 (along X direction) in a range from about 2 nm to about 7 nm. In some embodiments, the second portion 138B of the semiconductor inner spacer layer 138 has a second width D4 (along X direction) in a range from about 0.5 nm to about 3.5 nm. In some embodiments, the first portion 138A is wider than the second portion 138B. In some embodiments, a ratio of the second width D4 to the first width D3 is in a range from about 0.1 to about 0.5.

In some embodiments, the semiconductor inner spacer layer 138 are made of any suitable semiconductor material, such as Si, SiP, SiC, SiCP, SiB, or a combination thereof. In some embodiments, the semiconductor inner spacer layer 138 is undoped such as intrinsic silicon. For example, an impurity (or an n-type dopant and/or a p-type dopant) in the semiconductor inner spacer layer 138 has a concentration of less than about $10^{14}$ cm$^{-3}$.

In alternative embodiments, the semiconductor inner spacer layer 138 is doped in-situ with an n-type dopant or a p-type dopant during the epitaxial growth process. In some embodiments, the dopant in the semiconductor inner spacer layer 138 has a concentration in a range from about $1\times10^{19}$ cm$^{-3}$ to about $9\times10^{19}$ cm$^{-3}$. For example, the n-type dopant may be phosphorous (P) or Arsenic (As); the p-type dopant may be boron (B) or $BF_2$.

FIG. 1H is a perspective view illustrating a semiconductor structure 100 after the formation of source/drain features 140, in accordance with some embodiments. FIGS. 1H-1 and 1H-2 are cross-sectional views of the semiconductor structure 100 of FIG. 1H taken along lines X-X and Y2-Y2, in accordance with some embodiments.

Source/drain features 140 are formed on the semiconductor inner spacer layer 138 in the source/drain recesses 134, as shown in FIGS. 1H, 1H-1 and 1H-2, in accordance with some embodiments. The source/drain features 140 are formed on opposite sides of the dummy gate structure 118, in accordance with some embodiments. The source/drain features 140 are nested within the semiconductor inner spacer layer 138, as shown in FIG. in accordance with some embodiments. As such, the source/drain features 140 are separated from the first semiconductor layers 106 by the first portion 138A of the semiconductor inner spacer layer 138, from the second semiconductor layers 106 by the second portion 138B of the semiconductor inner spacer layer 138, and from the lower fin element 104L by the third portion 138C of the semiconductor inner spacer layer 138, in accordance with some embodiments.

The source/drain features 140 each include a root portion 140B interposing and/or confined within the fin spacer layers 132 and a head portion 140A protruding above the fin spacer layers 132, as shown in FIG. 1H-2, in accordance with some embodiments. The fin spacer layers 132 may confine the lateral growth of the source/drain feature 140, and therefore the head portion 140A of the source/drain feature 140 may have a small size, which may reduce the parasitic capacitance.

The source/drain features 140 are selectively grown from the semiconductor surface provided by the semiconductor inner spacer layer 138 using one or more epitaxial growth processes, in accordance with some embodiments. The epitaxial growth processes may be MBE, MOCVD, or VPE, another suitable technique, or a combination thereof. In some embodiments, the source/drain features 140 are made of any suitable semiconductor material for n-type semiconductor devices or p-type semiconductor devices, such as Ge, Si, GaAs, AlGaAs, SiGe, GaAsP, SiP, SiC, SiCP, or a combination thereof. The source/drain features 140 may be formed separately for n-type semiconductor devices and p-type semiconductor devices.

In some embodiments wherein the fin structure 104 is to be formed as an N-type GAA field effect transistor (FET), the source/drain features 140 are made of semiconductor material such as SiP, SiCP, SiC, Si, GaAs, another suitable semiconductor material, or a combination thereof. In some embodiments, the source/drain features 140 are doped with the n-type dopant during the epitaxial growth process. For example, the n-type dopant may be phosphorous (P) or Arsenic (As).

In some embodiments wherein the fin structure 104 is to be formed as a P-type GAA FET, the source/drain features 140 are made of semiconductor material such as SiGe, Si, GaAs, another suitable semiconductor material, or a combination thereof. In some embodiments, the second source/drain features 146 are doped with the p-type dopant during the epitaxial growth process. In some embodiments, the source/drain features 140 are doped with the p-type dopant during the epitaxial growth process. For example, the p-type dopant may be boron (B) or $BF_2$.

In some embodiments, the dopant in the source/drain features 140 has a concentration in a range from about $1\times10^{19}$ cm$^{-3}$ to about $9\times10^{21}$ cm$^{-3}$. In some embodiments, the semiconductor inner spacer layer 138 is doped with the same conductivity-type dopant as that doped in the source/drain features 140. In some embodiments, the dopant concentration in the source/drain features 140 is greater than the dopant concentration in the semiconductor inner spacer layer 138, e.g., by about two orders.

Because the epitaxial growth process for forming the source/drain feature 140 is a high-temperature process, the dopant from the source/drain feature 140 may be driven into the semiconductor inner spacer layer 138 with low dopant concentration. As such, the source/drain junction may be formed in and/or pass through the semiconductor inner spacer layer 138, in accordance with some embodiments.

In some embodiments, the lattice constants of the source/drain features 140 are different from the lattice constant of the second semiconductor layer 106 of the fin structure 104, so that the channel of the resulting transistor can be strained or stressed (e.g., tensile strain for an N-type device or compressive strain for a P-type device) by the source/drain features 140, thereby improving the mobility of carriers (e.g., electron or holes) of the resulting transistor and enhance the device performance.

In accordance with some embodiments of the present disclosure, the source/drain features 140 are selectively grown from the semiconductor surface provided by the semiconductor inner spacer layer 138, which may mitigate or eliminate the formation of the crystalline defects (e.g., stacking fault and/or dislocation) within the source/drain features 140 proximate to the channel of the resulting transistor. The source/drain features 140, grown on the semiconductor inner spacer layer 138, may have a lower density of crystalline defects as compared to the case that the source/drain features are formed in contact with dielectric inner spacer layer. As a result, the channel of the resulting transistor can be further strained or stressed by the source/drain features 140, thereby further enhancing the device performance.

FIG. 1I is a perspective view illustrating a semiconductor structure 100 after the formation of a contact etching stop layer (CESL) 142 and an interlayer dielectric (ILD) layer 144, in accordance with some embodiments. FIGS. 1I-1 and 1I-2 are cross-sectional views of the semiconductor structure 100 of FIG. 1I taken along lines X-X and Y2-Y2, in accordance with some embodiments.

A contact etching stop layer 142 is conformally formed over the semiconductor structure 100, as shown in FIGS. 1I, 1I-1 and 1I-2, in accordance with some embodiments. The contact etching stop layer 142 extends along and covers the surfaces of the source/drain features 140, in accordance with some embodiments. The contact etching stop layer 142 also extends along and covers the sidewalls of the gate spacer layers 124 facing the channel region, in accordance with some embodiments. The contact etching stop layer 142 is also formed along the isolation structure 112 and the fin spacer layers 132, in accordance with some embodiments.

An interlayer dielectric layer 144 is then formed over the contact etching stop layer 142, as shown in FIGS. 1I, 1I-1 and 1I-2, in accordance with some embodiments. The interlayer dielectric layer 144 fills the space between the dummy gate structures 118, in accordance with some embodiments.

In some embodiments, the contact etching stop layer 142 is made of a dielectric material, such as silicon oxide ($SiO_2$), silicon nitride (SiN), oxygen-doped silicon carbide (SiC:O), oxygen-doped silicon carbon nitride (SiCN:O), or a combination thereof. In some embodiments, a dielectric material for the contact etching stop layer 142 is globally deposited over the semiconductor structure 100 using CVD (such as LPCVD, PECVD, HDP-CVD, HARP, and FCVD), ALD, another suitable method, or a combination thereof.

In some embodiments, the interlayer dielectric layer 144 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, a dielectric material for the interlayer dielectric layer 144 is deposited using such as CVD (such as HDP-CVD, PECVD, or HARP), another suitable technique, and/or a combination thereof.

Afterward, the dielectric materials for the contact etching stop layer 142 and the interlayer dielectric layer 144 above the upper surface of the dummy gate electrode layer 122 are removed using such as CMP until the upper surfaces of the dummy gate electrode layer 122 are exposed. During the removal process, the hard mask layer 124 may be also removed. In some embodiments, the upper surface of the interlayer dielectric layer 144 is substantially coplanar with the upper surfaces of the dummy gate electrode layer 122.

FIG. 1J is a perspective view illustrating a semiconductor structure 100 after the removal of the dummy gate structure 118, in accordance with some embodiments. FIGS. 1J-1, 1J-2 and 1J-3 are cross-sectional views of the semiconductor structure 100 of FIG. 1J taken along lines X-X, Y2-Y2 and Y1-Y1, in accordance with some embodiments.

The dummy gate structure 118 including the dummy gate electrode layer 122 and the dummy gate dielectric layer 120 are removed using an etching process to form a gate trench 146, as shown in FIGS. 1J, 1J-1 and 1J-3, in accordance with some embodiments. The gate trench 146 exposes the channel region of the fin structure 104, in accordance with some embodiments. In some embodiments, the gate trench 146 also exposes the sidewalls of the gate spacer layers 130 facing the channel region, in accordance with some embodiments.

In some embodiments, the etching process includes one or more etching processes. For example, when the dummy gate electrode layer 122 are made of polysilicon, a wet etchant such as a tetramethylammonium hydroxide (TMAH) solution may be used to selectively remove the dummy gate electrode layer 122. For example, the dummy gate dielectric layer 120 may be thereafter removed using a dry plasma etching, a dry chemical etching, and/or a wet etching.

FIG. 1K is a perspective view illustrating a semiconductor structure 100 after the removal of the first semiconductor layers 106 of the fin structure 104, in accordance with some embodiments. FIGS. 1K-1, 1K-2 and 1K-3 are cross-sectional views of the semiconductor structure 100 of FIG. 1K taken along lines X-X, Y2-Y2 and Y1-Y1, in accordance with some embodiments.

A channel releasing process is performed on the semiconductor structure 100 to remove the first semiconductor layers 106 of the fin structure 104 using an etching process, thereby forming gaps 148, as shown in FIGS. 1K, 1K-1 and 1K-3, in accordance with some embodiments. The gaps 148 are formed between the neighboring second semiconductor layers 108 and between the lowermost second semiconductor layer 108 and the lower fin element 104L, in accordance with some embodiments. In some embodiments, the gaps 148 also expose the sidewall of the first portion 138A of the semiconductor inner spacer layer 138 facing the channel region, in accordance with some embodiments.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions. The first portion 138A of the semiconductor inner spacer layer 138 may be used as an etching stop layer, preventing the damage to the source/drain features 140 caused by the etching process.

After the etching process, the four main surfaces of the second semiconductor layers 108 of the fin structure 104 are exposed from the gate trench 146 and the gaps 148, in accordance with some embodiments. The exposed second semiconductor layers 108 of the fin structure 104 form nanostructures (e.g., nanowire or nanosheet structures) that function as channel of the resulting semiconductor devices (e.g., gate-all-around FETs), in accordance with some embodiments.

FIG. 1.1, is a perspective view illustrating a semiconductor structure 100 after the formation of final gate stack 150, in accordance with some embodiments. FIGS. 1L-1, 1L-2, 1L-3 and 1L-4 are cross-sectional views of the semiconductor structure 100 of FIG. 1L taken along lines X-X, Y2-Y2, Y1-Y1 and Y3-Y3, in accordance with some embodiments.

An interfacial layer 152 is formed on the exposed surfaces of the nanostructures 108, the lower fin element 104L, and the first portion 138A of the semiconductor inner spacer layer 138, as shown in FIGS. 1L-1 and 1L-3, in accordance with some embodiments. The interfacial layer 152 wraps around the nanostructures 108, in accordance with some embodiments.

In some embodiments, the interfacial layer 152 is made of a chemically formed silicon oxide. In some embodiments, the interfacial layer 152 is formed using one or more cleaning processes such as including ozone ($O_3$), ammonia hydroxide-hydrogen peroxide-water mixture, and/or hydrochloric acid-hydrogen peroxide-water mixture. Semiconductor material from the nanostructures 108, the lower fin element 104L and the semiconductor inner spacer layer 138 are oxidized to form the interfacial layers 152, in accordance with some embodiments.

A high-k gate dielectric layer 154 is formed conformally along the interfacial layers 152 to wrap around the nanostructures 108, as shown in FIGS. 1L-1 and 1L-3, in accordance with some embodiments. The high-k dielectric layer 154 is also conformally formed along and covers the sidewalls of the gate spacer layers 130 facing the channel region, in accordance with some embodiments. The high-k dielectric layer 154 is also conformally formed along the upper surface of the isolation structure 112, in accordance with some embodiments.

In some embodiments, the high-k dielectric layer 154 is made of a dielectric material with high dielectric constant (k value), for example, greater than 3.9. In some embodiments, the high-k dielectric material includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HMO, HfTiO, (Ba,Sr)$TiO_3$ (BST), $Al_2O_3$, $Si_3N_4$, oxynitrides (SiON), a combination thereof, or another suitable material. The high-k dielectric layer 154 may be deposited using ALD, PVD, CVD and/or another suitable technique.

A metal gate electrode layer 156 is formed over the high-k dielectric layer 154 and fills remainders of the gate trench 146 and the gaps 148, as shown in FIGS. 1L-1 and 1L-3, in accordance with some embodiments. The metal gate electrode layer 156 wraps the nanostructures 108, in accordance with some embodiments. In some embodiments, the metal gate electrode layer 156 continuously extends across the nanostructures 108.

In some embodiments, the metal gate electrode layer 156 is made of more than one conductive material, such as a metal, metal alloy, conductive metal oxide and/or metal nitride, another suitable conductive material, and/or a combination thereof. For example, the metal gate electrode layer 156 may be made of Ti, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof.

The metal gate electrode layer 156 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer.

The metal gate electrode layer 156 may be formed using ALD, PVD, CVD, e-beam evaporation, or another suitable process. The metal gate electrode layer 156 may be formed separately for n-channel FETs and p-channel FETs, which may use different work function materials.

A planarization process such as CMP may be performed on the semiconductor structure 100 to remove the materials of the high-k dielectric layer 154 and the metal gate electrode layer 156 formed above the upper surface of the interlayer dielectric layer 144, in accordance with some embodiments. After the planarization process, the upper surface of the metal gate electrode layer 156, the upper surface of the gate spacer layer 130 and the upper surface of the interlayer dielectric layer 144 are substantially coplanar, in accordance with some embodiments.

The interfacial layer 152, the high-k dielectric layer 154 and the metal gate electrode layer 156 combine to form a final gate stack 150, in accordance with some embodiments. In some embodiments, the final gate stack 150 extends in Y direction. That is, the final gate stack 150 has longitudinal axes parallel to Y direction, in accordance with some embodiments. The final gate stack 150 interposing the source/drain features 140 combine with the source/drain features 140 to form a GAA FET, in accordance with some embodiments. The final gate stack 150 wraps around a middle portion of each of the nanostructures 108, in accordance with some embodiments.

The first portion 138A of the semiconductor inner spacer layer 138 interposes between end portions of adjacent two nanostructures 108 and between the source/drain feature 140 and the final gate stack 150, in accordance with some embodiments. The first portion 138A of the semiconductor inner spacer layer 138 is in direct contact with the source/drain feature 140, the interfacial layer 152 of the final gate stack 150 and the gate spacer layer 130, in accordance with some embodiments. The second portion 138B of the semiconductor inner spacer layer 138 interposes the source/drain feature 140 and the nanostructures 108, in accordance with some embodiments. The third portion 138C of the semiconductor inner spacer layer 138 interposes the source/drain feature 140 and the lower fin elements 104L, in accordance with some embodiments.

FIG. 2 is a partially enlarged view of the cross-sectional views of FIG. 1L-1, in accordance with some embodiments. FIG. 2 illustrates a source/drain junction 158 which may define the source and/or drain and channel of the GAA FET. The source/drain junction 158 is located in and/or passes through the semiconductor inner spacer layer 138 because the dopant from the source/drain feature 140 is driven into the semiconductor inner spacer layer 138 during the epitaxial growth process for forming the source/drain feature 140, in accordance with some embodiments. The source/drain junction 158 is not pushed beyond the semiconductor inner spacer layer 138, and therefore the source/drain junction 158 does not overlap with the final gate stack 150, in accordance with some embodiments.

During operation, the final gate stack 150 may be coupled with the channel of the GAA FET, such that current 160 of the carriers (e.g., electrons or holes) can flow though the channel between the source and drain. The channel of the GAA includes a vertical portion and a horizontal portion, in accordance with some embodiments. A portion of the semiconductor inner spacer layer 138 outside the source/drain junction 158 adjacent to the final gate stack 150 is configured as the vertical portion of the channel where the current vertically flows, in accordance with some embodiments. The nanostructures 108 are configured as the horizontal portion of the channel where the current horizontally flows, in accordance with some embodiments. As a result, the effective gate length of the final gate stack 150 may extend both in the vertical direction and the horizontal direction.

In some instances where a dielectric inner spacer is formed between the source/drain feature and the gate stack, a source/drain junction may be pushed beyond the dielectric inner spacer and overlap with the gate stack. Such overlap may limit the scaling down of the minimum feature (e.g., gate stack) of the semiconductor device and reduce the control of the gate stack over the channel. Therefore, in accordance with the embodiments of the present disclosure, the semiconductor inner spacer layer 1:38 is configured as a vertical portion of the channel of the GAA FET, thereby providing a vertical component of the effective gate length, which may facilitate the continued miniaturization of a semiconductor device and improve the short channel effect (SCE).

It is understood that the semiconductor structure 100 may undergo further complementary metal-oxide semiconductor (CMOS) manufacturing processes to form a semiconductor device on the substrate 102, e.g., logic devices (e.g., CMOS devices), SRAM, etc. For example, various features, such as contact plugs, vias, interconnect metal layers, intermetal dielectric (IMD) layers, and/or passivation layers may be formed over the semiconductor structure 100.

As described above, the embodiments of the present disclosure provide a method which includes selectively growing the source/drain feature 140 on the semiconductor inner spacer layer 138. As a result, the source/drain features 140 may have a low density of crystalline defects (e.g., stacking fault and/or dislocation) therein, thereby straining or stressing the channel of the semiconductor device (e.g., GAA FET), which may enhance the device performance.

Furthermore, the embodiments of the present disclosure provide a semiconductor structure including a semiconductor inner spacer layer 138 interposing between the final gate stack 150 and the source/drain feature 140. The semiconductor inner spacer layer 138 is configured as a vertical portion of the channel of the semiconductor device (e.g., GAA FET), thereby providing a vertical component of the effective gate length. As a result, the continued miniaturization of a semiconductor device may be achieved, and the short channel effect may be improved, which may further enhance the device performance.

Embodiments of a semiconductor structure may be provided. The semiconductor structure may include a gate stack wrapping around a plurality of nanostructures and a source/drain feature adjacent to the plurality of nanostructures. The semiconductor structure may also include a semiconductor inner spacer layer interposing between the gate stack and the source/drain feature and interposing between the plurality of nanostructures and the source/drain feature. Therefore, the continued miniaturization of a semiconductor device may be achieved, and the device performance may be enhanced.

In some embodiments, a semiconductor structure is provided. The semiconductor structure includes a plurality of nanostructures vertically stacked and separated from one another. The semiconductor structure also includes a gate stack wrapping around the plurality of nanostructures. The semiconductor structure also includes a source/drain feature adjacent to the plurality of nanostructures. The semiconductor structure also includes a semiconductor inner spacer layer interposing between the gate stack and the source/drain feature and interposing between the plurality of nanostructures and the source/drain feature.

In some embodiments, a semiconductor structure is provided. The semiconductor structure includes a first nanostructure above a fin element. The first nanostructure includes first end portions and a first middle portion between the first end portions. The semiconductor structure also includes a second nanostructure above the first nanostructure. The second nanostructure includes second end portions and a second middle portion between the second end portions. The semiconductor structure also includes a gate stack wrapping around the first middle portion of the first nanostructure and the second middle portion of the second nanostructure. The semiconductor structure also includes a semiconductor inner spacer layer interposing between the first end portions of the first nanostructure and the second end portions of the second nanostructure.

In some embodiments, a method for forming a semiconductor structure is provided. The method includes forming a fin structure including alternating first semiconductor layers and second semiconductor layers. The method also includes etching a source/drain region of the tin structure to form a source/drain recess. The method also includes laterally recessing the first semiconductor layers of the fin structure from the source/drain recess to form notches. The method also includes forming a third semiconductor layer in the notches. The method also includes forming a source/drain feature in the source/drain recess. The method also includes removing the first semiconductor layers of the fin structure to form gaps exposing the second semiconductor layers of the fin structure. The method also includes forming a gate stack in the gaps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a plurality of nanostructures vertically stacked and separated from one another;
a gate stack wrapping around the plurality of nanostructures;
a source/drain feature adjacent to the plurality of nanostructures; and a semiconductor inner spacer layer interposing between the gate stack and the source/drain feature and interposing between the plurality of nanostructures and the source/drain feature,
wherein the gate stack comprises:
an interfacial layer wrapping around the plurality of nanostructures; and
a high-k gate dielectric layer wrapping around the interfacial layer, wherein the high-k gate dielectric layer is separated from the semiconductor inner spacer layer by the interfacial layer, and
wherein a source/drain junction passes through a portion of the semiconductor inner spacer layer between the source/drain feature and sidewalls of the plurality of nanostructures, and a portion of the semiconductor inner spacer layer between the nanostructures is interposed between the source/drain junction and the gate stack.

2. The semiconductor structure as claimed in claim 1, wherein a dopant concentration in the semiconductor inner spacer layer is less than a dopant concentration in the source/drain feature.

3. The semiconductor structure as claimed in claim 1, further comprising:
a gate spacer layer along a sidewall of the gate stack, wherein the semiconductor inner spacer layer extends below the gate spacer layer.

4. The semiconductor structure as claimed in claim 3, wherein the semiconductor inner spacer layer has a first sidewall surface covered by the gate spacer layer.

5. The semiconductor structure as claimed in claim 1, wherein the semiconductor inner spacer layer has a second sidewall surface covered by the interfacial layer, and wherein the gate stack further comprises:
a metal gate electrode layer wrapping around the high-k gate dielectric layer.

6. The semiconductor structure as claimed in claim 1, wherein a first portion of the semiconductor inner spacer layer interposing between the gate stack and the source/drain feature is wider than a second portion of the semiconductor inner spacer layer interposing between the plurality of nanostructures and the source/drain feature.

7. The semiconductor structure as claimed in claim 1, further comprising:
a fin element below the plurality of nanostructures and the source/drain feature, wherein the semiconductor inner spacer layer further interposes the source/drain feature and the fin element.

8. The semiconductor structure as claimed in claim 7, further comprising:
an isolation feature surrounding the fin element; and
fin spacer layers over the isolation feature and surrounding a root portion of the source/drain feature.

9. A semiconductor structure, comprising:
a first nanostructure above a fin element, wherein the first nanostructure comprises first end portions and a first middle portion between the first end portions;
a second nanostructure above the first nanostructure, wherein the second nanostructure comprises second end portions and a second middle portion between the second end portions;
a gate stack wrapping around the first middle portion of the first nanostructure and the second middle portion of the second nanostructure; and
a semiconductor inner spacer layer interposing between the first end portions of the first nanostructure and the second end portions of the second nanostructure,
wherein the gate stack comprises:
an interfacial layer, wherein the interfacial layer has a close-loop profile in a cross-correctional view between the first nanostructure and the second nanostructure; and
a high-k gate dielectric layer within the close-loop profile of the interfacial layer, and
wherein the semiconductor inner spacer layer includes a first portion covering and in direct contact with a sidewall surface of the one of the first end portions of the first nanostructure, a second portion covering and in direct contact with a sidewall surface of the one of the second end portions of the second nanostructure, and a third portion directly between the first nanostructure and the second nanostructure, a source/drain junction vertically extends in the first portion and the second portion of the semiconductor inner spacer layer, and the source/drain junction is spaced apart from the interfacial layer by the third portion of the semiconductor inner spacer.

10. A semiconductor structure as claimed in claim 9, wherein the gate stack is in direct contact with the semiconductor inner spacer layer.

11. The semiconductor structure as claimed in claim 9, further comprising:
a field effect transistor, wherein the semiconductor inner spacer layer is configured as a channel of the field effect transistor.

12. The semiconductor structure as claimed in claim 9, further comprising:
source/drain features over the fin element, wherein the source/drain features are separated from the first end portions of the first nanostructure by the semiconductor inner spacer layer and separated from the second end portions of the second nanostructure by the semiconductor inner spacer layer.

13. The semiconductor structure as claimed in claim 12, wherein the semiconductor inner spacer layer is further located between the fin element and the source/drain features.

14. The semiconductor structure as claimed in claim 12, wherein a dopant concentration in the semiconductor inner spacer layer is less than a dopant concentration in the source/drain features.

15. The semiconductor structure as claimed in claim 12, further comprising:
a gate spacer layer along the sidewall of the gate stack and in contact with the semiconductor inner spacer layer.

16. A method for forming a semiconductor structure, comprising:
forming a fin structure including alternating first semiconductor layers and second semiconductor layers;
etching a source/drain region of the fin structure to form a source/drain recess;
laterally recessing the first semiconductor layers of the fin structure from the source/drain recess to form notches;
forming a third semiconductor layer in the notches on sidewalls of the second semiconductor layers;
forming a source/drain feature in the source/drain recess, wherein during forming the source/drain feature, a dopant from the source/drain feature is driven into the third semiconductor layer, thereby forming a source/drain junction, and the source/drain junction passes through a portion of the third semiconductor layer formed the sidewalls of the second semiconductor layers;

removing the first semiconductor layers of the fin structure to form gaps exposing the second semiconductor layers of the fin structure; and forming a gate stack in the gaps.

17. The method for forming the semiconductor structure as claimed in claim 16, wherein the third semiconductor layer is further formed on surfaces of the second semiconductor layers of the fin structure exposed from the source/drain recess.

18. The method for forming the semiconductor structure as claimed in claim 17, wherein the source/drain feature is separated from the second semiconductor layers of the fin structure by the third semiconductor layer.

19. The method for forming the semiconductor structure as claimed in claim 18, wherein the first semiconductor layers of the fin structure are removed until the gaps expose the third semiconductor layer.

20. The method for forming the semiconductor structure as claimed in claim 18, wherein forming the gate stack comprises:

oxidizing the second semiconductor layers and the third semiconductor layer to form an interfacial layer;

forming a high-k gate dielectric layer over the interfacial layer; and forming a metal gate electrode layer over the high-k gate dielectric layer.

\* \* \* \* \*